(12) United States Patent
Li et al.

(10) Patent No.: US 8,340,448 B2
(45) Date of Patent: Dec. 25, 2012

(54) LOCALLY VARIABLE QUANTIZATION AND HYBRID VARIABLE LENGTH CODING FOR IMAGE AND VIDEO COMPRESSION

(75) Inventors: Junlin Li, San Jose, CA (US); Dihong Tian, San Jose, CA (US); Wen-hsiung Chen, Sunnyvale, CA (US); Yian Xu, Los Gatos, CA (US)

(73) Assignee: Cisco Technology, Inc., San Jose, CA (US)

( * ) Notice: Subject to any disclaimer, the term of this patent is extended or adjusted under 35 U.S.C. 154(b) by 593 days.

(21) Appl. No.: 12/574,409

(22) Filed: Oct. 6, 2009

(65) Prior Publication Data

US 2011/0080946 A1 Apr. 7, 2011

(51) Int. Cl.
G06K 9/36 (2006.01)
H04N 11/04 (2006.01)
G06K 9/46 (2006.01)

(52) U.S. Cl. .................................. 382/246; 375/240.03

(58) Field of Classification Search .................. 382/232, 382/233, 244, 246, 250, 251, 261; 375/240.03, 375/240.05, 240.13, 240.25, 240.27, 240.29, 375/243, 245, E07.001; 348/405, 406, 419.1; 341/50, 200

See application file for complete search history.

(56) References Cited

U.S. PATENT DOCUMENTS

| | | | | | |
|---|---|---|---|---|---|
| 5,677,689 | A * | 10/1997 | Yovanof et al. | ................. | 341/50 |
| 5,703,646 | A * | 12/1997 | Oda | ......................... | 375/240.13 |
| 6,167,087 | A * | 12/2000 | Kato | ......................... | 375/240.03 |
| 6,381,274 | B1 * | 4/2002 | Sugahara | ................. | 375/240.05 |
| 6,466,625 | B1 * | 10/2002 | Kobayashi et al. | ....... | 375/240.29 |
| 7,373,013 | B2 * | 5/2008 | Anderson | ...................... | 382/261 |
| 2003/0016878 | A1 * | 1/2003 | Motosu et al. | ................ | 382/251 |
| 2006/0018378 | A1 * | 1/2006 | Piccinelli et al. | ......... | 375/240.03 |
| 2008/0107185 | A1 * | 5/2008 | Lefol et al. | ............... | 375/240.25 |
| 2009/0154820 | A1 | 6/2009 | Li et al. | | |
| 2011/0080946 | A1 * | 4/2011 | Li et al. | .................... | 375/240.03 |

FOREIGN PATENT DOCUMENTS

WO WO 2009/046042 4/2009

OTHER PUBLICATIONS

J. Wen, M. Luttrell, and J. Villasenor, "Trellis-Based R-D Optimal Quantization in H.263+", IEEE Transactions on Image Processing, Aug. 2000. vol. 9, No. 8, pp. 1431-1434.

(Continued)

*Primary Examiner* — Amir Alavi
(74) *Attorney, Agent, or Firm* — Dov Rosenfeld; Inventek

(57) ABSTRACT

A coding method, apparatus, and storage media with instructions to carry out a method. The method operates on an ordered series of transform coefficients of a block of image data, and for a fixed quantization method, and includes quantizing and encoding the ordered series to form a coded bitstream. The quantizing and encoding uses one or more variable length code (VLC) mappings. The quantizing includes quantizing to have amplitude-1 at least one coefficient that would be quantized by the fixed quantization method to have zero amplitude, quantizing to have zero amplitude at least one coefficient that would be quantized by the fixed quantization method to have amplitude-1, and using the fixed quantization method to quantize any coefficient that is quantized by the fixed quantization method not to have zero amplitude, amplitude-1, or amplitude-2.

30 Claims, 12 Drawing Sheets

OTHER PUBLICATIONS

E.H. Yang and X. Yu, "Rate Distortion Optimization for H.264 Interframe Coding: A General Framework and Algorithms", IEEE Transactions on Image Processing, Jul. 2007, vol. 16, No. 7, pp. 1774-1784.

M. Luttrell, J. Wen and J.D. Villasenor, "Trellis-based R-D optimal quantization in H.263+," 2000 International Conference on Image Processing, Sep. 2000, Vancouver, Canada, vol. 2, pp. 852-854.

X. Han, W. Liu, X. Jin and Z. Ma, "Adaptive Quantization for Interlaced Video Coding," Proceedings, International Conference on Wireless Communications, Networking and Mobile Computing (WiCOM 2006), Sep. 2006. Wuhan, China, pp. 1-4.

N. Zhang, C.H. Wu, and J.D. Irwin, "An adaptive quantization-mapping model for MPEG encoders," Proceedings of the IEEE International Conference on Industrial Technology (ICIT '96), Dec. 1996, Shanghai, China, pp. 470-474.

J. Lee, "Rate-distortion optimization of parametrized quantization matrix for MPEG-2 encoding," 1998 International Conference on Image Processing (ICIP '98), Oct. 1998, vol. 2, pp. 383-386.

Crouse et al: "Joint Thresholding and Quantizer Selection for Transform Image Coding: Entropy-Constrained Analysis and Applications to Baseline JPEG", IEEE Transactions on Image Processing, vol. 6 No. 2, Feb. 1, 1997.

International Preliminary Report on Patentability for PCT Application No. PCT/US2010/050720 mailed Apr. 19, 2012.

E.H. Yang, L. Wang, "Joint Optimization of Run-Length Coding, Huffman Coding, and Quantization Table With Complete Baseline Jpeg Decoder Compatibility", IEEE Transactions on Image Processing, IEEE Service Center, Piscataway, NJ, US, Jan. 2009, vol. 18 No. 1, pp. 63-74.

W.H. Chen, W. Pratt, "Scene Adaptive Coder", IEEE Transactions on Communications, Mar. 1984, vol. Com-32, No. 3.

PCT International Search Report for PCT Application No. PCT/US2010/050720, 2010.

* cited by examiner

Table 1

| x | coefficient patterns |
|---|---|
| 0 | 11 |
| 1 | *1 |
| 2 | 1* |
| 3 | ** |

Event (Rz, 2, x)

| Table 2 | | | | | | |
|---|---|---|---|---|---|---|
| | Non-zero run-length of the recent cluster Rnz_pre | | | | | |
| | n5 to 64 | n4 to n5 | n3 to n4 | n2 to n3 | n1 to n2 | 1 to n1 |
| Max zero run-length of previous clusters | 0 to z1 | VLC00 | VLC01 | VLC02 | VLC03 | VLC04 | VLC05 |
| | z1 to z2 | VLC10 | VLC11 | VLC12 | VLC13 | VLC14 | VLC15 |
| | z2 to z3 | VLC20 | VLC21 | VLC22 | VLC23 | VLC24 | VLC25 |
| | z3 to z4 | VLC30 | VLC31 | VLC32 | VLC33 | VLC34 | VLC35 |
| | z4 to z5 | VLC40 | VLC41 | VLC42 | VLC43 | VLC44 | VLC45 |
| | z5 to 63 | VLC50 | VLC51 | VLC52 | VLC53 | VLC54 | VLC55 |

FIG. 5

| Table 3: An example of context-based VLC table selection for position coding |||||||
|---|---|---|---|---|---|---|
| | Present frequency index ||||||
| | 0 | 1 to $I_1$ | $I_1$ to $I_2$ | $I_2$ to $I_3$ | $I_3$ to $I_4$ | $I_4$ to 63 |
| Previous maximum Run_z = 0 | | $VLC_p0$ | $VLC_p0$ | $VLC_p1$ | $VLC_p1$ | $VLC_p2$ | $VLC_p2$ |
| $R_1$ | – | $VLC_p1$ | $VLC_p1$ | $VLC_p2$ | $VLC_p2$ | $VLC_p3$ |
| $R_2$ | – | $VLC_p1$ | $VLC_p2$ | $VLC_p3$ | $VLC_p3$ | $VLC_p4$ |
| $R_3$ | – | – | $VLC_p2$ | $VLC_p3$ | $VLC_p4$ | $VLC_p4$ |
| . . . | . . . | . . . | . . . | . . . | . . . | . . . |

LOCALLY VARIABLE QUANTIZATION AND HYBRID VARIABLE LENGTH CODING FOR IMAGE AND VIDEO COMPRESSION

RELATED APPLICATIONS

The present invention is related to commonly assigned U.S. patent application Ser. No. 12/336,364 filed Dec. 16, 2008 to Li et al., and titled CONTEXT ADAPTIVE HYBRID VARIABLE LENGTH CODING (hereinafter U.S. Ser. No. 12/336,364), which is a continuation in part of commonly assigned U.S. patent application Ser. No. 12/016,441 filed Jan. 18, 2008 to Tian et al., and titled CONTEXT ADAPTIVE POSITION AND AMPLITUDE CODING OF COEFFICIENTS FOR VIDEO COMPRESSION (hereinafter U.S. Ser. No. 12/016,441). U.S. Ser. No. 12/336,364 is also a continuation in part of commonly assigned U.S. patent application Ser. No. 12/030,821 filed Feb. 13, 2008 to inventors Li et al, and titled VARIABLE LENGTH CODING OF COEFFICIENT CLUSTERS FOR IMAGE AND VIDEO COMPRESSION (hereinafter U.S. Ser. No. 12/030,821). U.S. Ser. No. 12/016,411 claims priority of U.S. Provisional Application 60/976,853 filed Oct. 2, 2007. Patent application Ser. No. 12/030,821 claims priority of U.S. 60/976,742, filed Oct. 1, 2007. The contents of each of U.S. Ser. No. 12/336,364, U.S. Ser. No. 12/016,441, U.S. Ser. No. 12/030,821, U.S. 60/976,853, and U.S. 60/976,742 are incorporated herein by reference, except any material incorporated by reference in any of the U.S. Ser. No. 12/336,364, U.S. Ser. No. 12/016,441, U.S. Ser. No. 12/030,821, U.S. 60/976,853, and U.S. 60/976,742 and not explicitly incorporated by reference in the present disclosure.

FIELD OF THE INVENTION

The present disclosure relates generally to image and video compression, and in particular to quantization and variable length coding of transform coefficients as occurs in transform-based image and video compression methods.

BACKGROUND

Transform coding and decoding of video data usually includes what is called entropy coding. For compression, the pixel information of a picture, e.g., of a residual picture after motion compensated prediction, or of a picture for intra-coding is divided into blocks. The blocks are transformed, e.g., by a discrete cosine transform (DCT) or a similar transform, and the resulting transform coefficients are quantized. The quantized transform coefficients are ordered, e.g., from low to higher frequencies along a path in the two dimensional transform domain. The ordered series of quantized transform coefficients is then losslessly encoded by an entropy coding method. One popular entropy coding method is variable length coding in which one or more events, representing one or more quantized coefficients of properties thereof are encoded by codewords such that events that are more likely-to-occur are more likely to be encoded by codewords that are shorter than are events that are less likely-to-occur. Variable length coding (VLC), due to its nice tradeoff in efficiency and simplicity, has been widely used in entropy coding, particularly when the codec is desired to have low computational complexity.

Coding methods disclosed in U.S. Ser. No. 12/016,441 include a two-way position and amplitude coding process for a series of quantized coefficients. Positions of non-zero quantized transform coefficients are ordered, e.g., in a forward zigzag scan order and by multiple VLC tables with adaptive table switch based on the context. By context is meant one or more items of information determinable from previously encoded information and useful in predicting behavior, e.g., information determined from previously coded coefficients. Amplitudes of the quantized coefficients, on the other hand, are coded in an order reverse to the forward zigzag scan order and are regrouped into sub-sequences according to their adjacency to zeros. These sub-sequences are coded with different respective (multidimensional) VLC mappings that have different dimensionality.

Coding methods disclosed in U.S. Ser. No. 12/030,821 include encoding the run-length of each cluster of non-zero-valued quantized coefficients and the run-length of each cluster's preceding zero coefficients together as a pair, in combination with a parameter that indicates the number of trailing coefficients in that non-zero cluster that have a amplitude of 1. Remaining amplitudes are coded separately by a one-dimensional VLC mapping, e.g., a code table.

Coding methods disclosed in Ser. No. 12/336,364 include jointly encoding coefficient positions with the run lengths of coefficients having trailing amplitude 1, and coding remaining amplitudes of each cluster by one-dimensional (1D) VLC. In addition, the methods take into account previously coded neighboring coefficient blocks in coding a particular block. Multiple VLC code mappings, e.g., code tables are used, with context-based table switch.

The inventors investigated modifying the quantization locally in order to reduce the number of clusters, and thus reduce the number of bits required to encode the transform coefficients of an image block without significantly affecting the image quality.

BRIEF DESCRIPTION OF THE DRAWINGS

FIG. 5 shows one example of threshold based selection of 3-D VLC tables for coding in some embodiments of the invention.

FIG. 7 shows Table 3 that illustrates by way of example, how in some embodiments, a VLC table is selected based upon the previous maximum run of zero-valued quantized coefficients preceding a non-zero-value and the present frequency index components.

DESCRIPTION OF EXAMPLE EMBODIMENTS

Overview

Figures 1, 2:
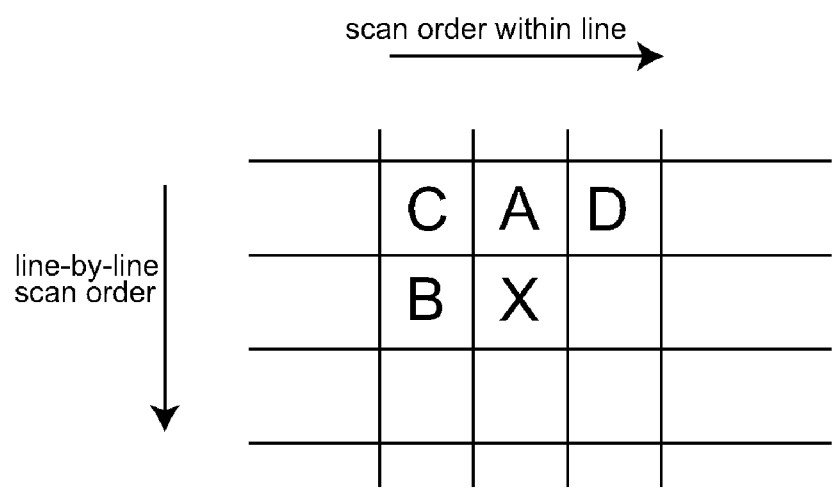
FIG. 1 shows a table for the value of a parameter x for different patterns for a particular length 2 event as used in embodiments of the present invention.
FIG. 2 shows a scan order of coding a two-dimensional array of image blocks in a left-to-right order within a row, and a top-to-bottom row-by-row order, and also shows a currently being coded block X and two previously coded neighbor blocks A and B.

Embodiments of the present invention include a method, and apparatus, and logic encoded in one or more computer-readable tangible medium to carry out a method. The method is to code an ordered series of transform coefficients obtained by transforming a block of image data. The method accepts the coefficients in unquantized form, or in some embodiments already quantized according to a conventional fixed quantization method. In some embodiments, the method includes quantizing the series of unquantized coefficients according to the fixed quantization method.

For an ordered series of transform coefficients of a block of image data, the ordering from low to high spatial frequency according to a transform, and for the fixed quantization method that quantizes coefficient values of blocks of image data to quantized values that have amplitudes including a most likely-to-occur amplitude, a second-most likely-to-occur amplitudes and at least one other amplitude, including a third-most likely-to-occur amplitude, the method includes quantizing and encoding the ordered series to form a coded bitstream. The quantizing and encoding uses one or more variable length code (VLC) mappings, e.g., as described in any one or more of U.S. Ser. No. 12/336,364, U.S. Ser. No. 12/016,441, U.S. Ser. No. 12/030,821. The quantizing includes quantizing to have the second-most likely-to-occur amplitude at least one coefficient that would be quantized by the fixed quantization method to have the most likely-to-occur amplitude, quantizing to have the most likely-to-occur amplitude at least one coefficient that would be quantized by the fixed quantization method to have the second-most likely-to-occur amplitude, and using the fixed quantization method to quantize any coefficient that is quantized by the fixed quantization method to have other than the most likely-to-occur amplitude, other than the second-most likely-to-occur amplitude, or other than the third-most likely-to-occur amplitude.

Some embodiments of the present invention incorporate the VLC schemes described in one or more of U.S. Ser. No. 12/336,364, U.S. Ser. No. 12/016,441, and U.S. Ser. No. 12/030,821. By integrating the locally variable quantization features of the present invention with a VLC method, e.g., one of the VLC schemes described in one or more of U.S. Ser. No. 12/336,364, U.S. Ser. No. 12/016,441, U.S. Ser. No. 12/030,821, the invention is expected to further improve the compression efficiency of high-resolution image and video content.

While this summary describes embodiments in which a fixed quantization method quantizes transform coefficients to have amplitudes such that 0 is the most likely-to-occur amplitude, 1 is the second-most likely-to-occur amplitude and there is at least one other amplitude, including 2 being the third-most likely-to-occur amplitude, the invention is not limited to such a fixed quantization method, and can be applied to the case of a fixed quantization method that quantizes to any of a set of values that can have other values for the most likely-to-occur amplitude, the second-most likely-to-occur amplitude and/or the third-most likely-to-occur amplitude. How to generalize to such embodiments would be clear and straightforward to one having ordinary skill in the art. The claims are written in the more general form.

Particular embodiments include a method of coding an ordered series of transform coefficients of a block of image data, the coding using a coding apparatus. The method comprises, for a first region of an ordered series of transform coefficients of a block of image data and for a fixed quantization method that is used in the method, quantizing and encoding the first region and any other regions of the ordered series to form a coded bitstream, and outputting or storing the coded bitstream. The ordering is from low to high spatial frequency according to a transform. The first region is possibly the whole region. The fixed quantization method quantizes coefficient values of blocks of image data to quantized values that have amplitudes including 0, being the most likely-to-occur amplitude, 1, being the second-most likely-to-occur amplitude and at least one other amplitude, including 2, being the third-most likely-to-occur amplitude. The quantizing and encoding of the first region uses one or more variable length code mappings. The quantizing of the first region includes quantizing to have amplitude-1 at least one coefficient that would be quantized by the fixed quantization method to have zero-amplitude, quantizing to have zero-amplitude at least one coefficient that would be quantized by the fixed quantization method to have the second-most likely-to-occur amplitude, and using the fixed quantization method to quantize any coefficient that is quantized by the fixed quantization method not to have zero amplitude, amplitude-1, or other than amplitude-2.

Particular embodiments include a computer-readable medium encoded with computer-executable instructions that when executed by at least one processor of a processing system causes carrying out of a method of coding an ordered series of transform coefficients of a block of image data. The method comprises, for a first region of an ordered series of transform coefficients of a block of image data and for a fixed quantization method that is used in the method, quantizing and encoding the first region and any other regions of the ordered series to form a coded bitstream, and outputting or storing the coded bitstream. The ordering is from low to high spatial frequency according to a transform. The first region is possibly the whole region. The fixed quantization method quantizes coefficient values of blocks of image data to quantized values that have amplitudes including 0, being the most likely-to-occur amplitude, 1, being the second-most likely-to-occur amplitude and at least one other amplitude, including 2, being the third-most likely-to-occur amplitude. The quantizing and encoding of the first region uses one or more variable length code mappings. The quantizing of the first region includes quantizing to have amplitude-1 at least one coefficient that would be quantized by the fixed quantization method to have zero-amplitude, quantizing to have zero-amplitude at least one coefficient that would be quantized by the fixed quantization method to have the second-most likely-to-occur amplitude, and using the fixed quantization method to quantize any coefficient that is quantized by the fixed quantization method not to have zero amplitude, amplitude-1, or amplitude-2.

Particular embodiments include an apparatus configured to encode an ordered series of transform coefficients of a block of image data, the ordering from low to high spatial frequency according to a transform. When a fixed quantizer operates on the transform coefficients, the resulting quantized coefficients have an amplitude including 0, the most likely-to-occur amplitude, and at least one other amplitude including amplitude 1, the second most likely-to-occur amplitude. The third-most likely-to-occur amplitude is 2. The apparatus includes a quantizer and encoder configured to quantize and encode the first region and any other regions of the ordered series to form a coded bitstream. The quantizer and encoder includes a first region quantizer and encoder configured to quantize and encode of first region using one or more variable length code mappings. The quantizing of the first region includes quantizing to have amplitude-1 at least one coefficient that would be quantized by the fixed quantization method to have zero-amplitude, quantizing to have zero-amplitude at least one coefficient that would be quantized by the fixed quantization method to have the second-most likely-to-occur amplitude, and using the fixed quantization method to quantize any coefficient that is quantized by the fixed quantization method not to have zero amplitude, amplitude-1, or amplitude-2.

Particular embodiments include a method of decoding a coded bitstream using a decoding apparatus. The coded bitstream includes a set of concatenated codewords. The method of decoding includes recognizing codewords in the bitstream, the codewords formed by a coding method of coding an ordered series of transform coefficients of a block of image data using one or more of a plurality of VLC mappings. The coding method comprises, for a first region of an ordered series of transform coefficients of a block of image data and for a fixed quantization method that is used to quantize at least some coefficients, quantizing and encoding the first region and any other regions of the ordered series to form the coded bitstream, and outputting or storing the coded bitstream. The ordering is from low to high spatial frequency according to a transform. The first region is possibly the whole region. The fixed quantization method quantizes coefficient values of blocks of image data to quantized values that have amplitudes including 0, being the most likely-to-occur amplitude, 1, being the second-most likely-to-occur amplitude and at least one other amplitude, including 2, being the third-most likely-to-occur amplitude. The quantizing and encoding of the first region uses one or more variable length code mappings. The quantizing of the first region includes quantizing to have amplitude-1 at least one coefficient that would be quantized by the fixed quantization method to have zero-amplitude, quantizing to have zero-amplitude at least one coefficient that would be quantized by the fixed quantization method to have the second-most likely-to-occur amplitude, and using the fixed quantization method to quantize any coefficient that is quantized by the fixed quantization method not to have zero amplitude, amplitude-1, or amplitude-2. The method of decoding further includes decoding the recognized codewords using one or more of a plurality of VLC mappings.

Particular embodiments include a computer-readable medium encoded with computer-executable instructions that when executed by at least one processor of a processing system causes carrying out a method of decoding a coded bitstream as described in the above paragraph.

Particular embodiments include an apparatus configured to decode a set of concatenated codewords formed by a coding method. The apparatus includes a codeword recognizer configured to recognize codewords in the set of concatenated codewords. The codewords are formed by a coding method of coding an ordered series of transform coefficients of a block of image data using one or more of a plurality of VLC mappings. The coding method comprises, for a first region of an ordered series of transform coefficients of a block of image data and for a fixed quantization method, quantizing and encoding the first region and any other regions of the ordered series to form the coded bitstream, and outputting or storing the coded bitstream. The ordering is from low to high spatial frequency according to a transform. The first region is possibly the whole region. The fixed quantization method quantizes coefficient values of blocks of image data to quantized values that have amplitudes including 0, being the most likely-to-occur amplitude, 1, being the second-most likely-to-occur amplitude and at least one other amplitude, including 2, being the third-most likely-to-occur amplitude. The quantizing and encoding of the first region uses one or more variable length code mappings. The quantizing of the first region includes quantizing to have amplitude-1 at least one coefficient that would be quantized by the fixed quantization method to have zero-amplitude, quantizing to have zero-amplitude at least one coefficient that would be quantized by the fixed quantization method to have the second-most likely-to-occur amplitude, and using the fixed quantization method to quantize any coefficient that is quantized by the fixed quantization method not to have zero amplitude, amplitude-1, or amplitude-2. The apparatus further includes a codeword decoder configured to decode the recognized codewords using one of more VLC mappings.

In some embodiments of the above-described method of coding, and of the above-described method of decoding, and of the above-described computer-readable storage media, and of the above-described apparatuses, the quantizing and encoding of the first region includes, for a pre-defined first region VLC method, selecting as quantization for the coefficients that are quantized by the fixed quantization method to have amplitude 0, 1, or 2, the quantized amplitude values that minimize a rate distortion function using the pre-defined first region VLC method, with any coefficient that has amplitude between 0 and the largest coefficient amplitude that is quantized to 1 by the fixed quantization method being allowed to be quantized to either 0 or 1, and any coefficient that has amplitude more than the largest coefficient amplitude that is quantized by the fixed quantization method to amplitude 1 and less than the largest coefficient amplitude that is quantized by the fixed quantization method to amplitude 2 being allowed to be quantized to either 1 or 2.

In other embodiments of the above-described method of coding, and of the above-described method of decoding, and of the above-described computer-readable storage media, and of the above-described apparatuses, the series is an ordered sequence of quantized transform coefficients quantized by the fixed quantization method and the method comprises, for the first region which could be the whole series, encoding the position of events in the first region using one or more position VLC mappings, each event whose position is encoded including either exactly one quantized coefficient having non-zero amplitude or a cluster of quantized coefficients each having non-zero amplitude, and encoding any non-zero amplitude that is still to be encoded, the encoding according to one or more amplitude VLC mappings. The encoding of the position of events includes modifying the quantization of quantized coefficients from quantization of the fixed quantization method according to one or more quantization modification methods of the set consisting of a first quantization modification method, a second quantization modification method, a third quantization modification method, a fourth quantization modification method, and a fifth quantization modification method. The first quantization modification method including replacing an isolated quantized coefficient having amplitude-1 with a quantized coefficient having zero-amplitude. The second quantization modification method including replacing an isolated quantized coefficient having zero-amplitude with a quantized coefficient having amplitude-1. The third quantization modification method including replacing a pair of quantized coefficients starting with first quantized coefficient having zero-amplitude followed by a second quantized coefficient having the amplitude-1, the pair preceded by a sequence of one or more quantized coefficients having non-zero amplitude and followed by one or more quantized coefficients having zero-amplitude, the replacing with either a pair of quantized coefficients each having zero-amplitude or a pair of quantized coefficients each having amplitude-1 according to which replacing results in a coded bitstream that is shorter. The fourth quantization modification method including replacing a pair of coefficients with the first quantized coefficient having amplitude-1 followed by a second quantized coefficient having zero-amplitude, the pair preceded by a sequence of one or more quantized coefficients having zero-amplitude and followed by one or more quantized coefficients having non-zero amplitude, the replacing with either a pair of quantized coefficients each having zero-amplitude or a pair of quantized coefficients each having amplitude-1 according to which replacing results in a coded bitstream that is shorter. The fifth quantization modification method including replacing, in a position event, a quantized coefficient having amplitude-2 followed by a trailing sequence of one or more coefficients having amplitude-1 in the position event, no other coefficients having other that zero-amplitude following the trailing sequence in the position event. In particular, the modifying the quantization including at least the second quantization modification method, the third quantization modification method, the fourth quantization modification method, or the fifth quantization modification method.

Some embodiments of context adaptive hybrid variable length coding described herein include, for a first region, which might be the whole ordered series of quantized transform coefficients, a three-dimensional joint position and amplitude coding process and a one-dimensional (1-D) amplitude process, both of which are carried out in a context adaptive fashion.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Position and Amplitude Coding Methods

In transform coding, an image is partitioned into blocks, and each block of image data is transformed by a transform such as the discrete cosine transform (DCT) as in MPEG-1, MPEG-2, and so forth, an integer transform such as used in ITU-T recommendation H.264, known as H.264/AVC and as MPEG-4, part 10, or some other transform wherein the transform domain has an ordering that somehow is indicative of spatial frequency.

For the description herein, suppose the transform coefficients are quantized such that 0 is the most likely-to-occur amplitude, 1 is the next most likely-to-occur amplitude, i.e., the second-most likely-to-occur amplitude, and 2 is the next most likely-to-occur amplitude, i.e., the third-most likely-to-occur amplitude. The invention, however, is not limited to such a case. Those in the art would recognize that the quantization mapping of assigning different ones of a finite number of "amplitudes" to ranges of coefficient amplitudes can be such that a value other than 0 is assigned to the most likely-to-occur amplitude range, and a value other than 1 is assumed to the second-most likely-to-occur amplitude range.

The transform coefficients are ordered in a forward spatial frequency direction, e.g., along a zigzag order of increasing frequency in a two-dimensional spatial frequency plane. Consider the ordered series of transform coefficients in the forward, i.e., increasing spatial frequency order. After quantization by a conventional fixed quantization method, e.g., the quantization used in H.264/AVC, such a forward scanned series includes clusters of consecutive non-zero-valued coefficients. Unless a non-zero amplitude is the last quantized coefficient in the series, which is typically unlikely, each cluster is followed by at least one zero-valued quantized coefficient. In embodiments of the present invention, a cluster as coded is defined as including one immediately following zero-valued quantized coefficient. The clusters may be preceded by consecutive zero-valued quantized coefficients. Thus, each cluster and any preceding 0s can be defined by two quantities, the size of the cluster, and the length of any preceding run of zero-valued quantized coefficients. Denote by Rnz, Rnz≧1, the number of non-zero-amplitude quantized coefficients in a cluster that includes one following zero-valued coefficient, and denote by Rz, Rz≧0 the number of consecutive zero-values preceding the cluster. Thus the run-length pair (Rz, Rnz), Rz≧0, Rnz≧1 defines Rz zero-valued quantized coefficients, followed by Rnz non-zero-valued quantized amplitudes, followed by one 0. For example, a coefficient sequence: 9 5 3 0 1 3 0 0 1 0 . . . 0 is defined by the three coefficient clusters: 9 5 3 0, 1 3 0, and 0 1 0, the positions of non-zero and zeroes is defined by the three pairs (0, 3), (0, 2) (1, 1).

Variable length coding embodiments include coding events for clusters by codewords such that, when considering all possible images, on average, the more likely an event is to occur, the shorter the codeword used to encode the event. An event is often also called a symbol in the literature on coding. The cluster events represent the quantized amplitudes in a cluster of non-zero coefficients.

Locally Variable Quantization

In general, after quantization by a fixed quantization method such as that used in H.264/AVC, or that used in H.263, non-zero-valued coefficients are more clustered in low frequency region, and more scattered in high frequency region, such that the clusters of non-zero-valued coefficients becomes smaller as the frequency increases, e.g., from a low frequency region to a high frequency region. Conversely, in general, zero-valued coefficients are more scattered in low frequency region, while more clustered in high frequency region, such that the clusters of zero-valued coefficients becomes larger as the frequency increases, e.g., from a low frequency region to a high frequency region.

Hybrid variable length coding takes advantage of such a tendencies by using a first region variable length coding method that is designed for, e.g., that is particularly efficient for coding clusters of non-zero-valued coefficients in a first, low-frequency region, and a second variable length coding method that is designed for, e.g., that is particularly efficient for coding long run lengths of zero-valued coefficients with isolated small-value, e.g., isolated amplitude-1 coefficients in a second region of higher frequencies than those of the first region.

Non-zero-valued coefficients have smaller amplitudes as the frequency increases, e.g., from a low frequency region to a high frequency region, such that non-zero-valued coefficients tend to have amplitude-1 at the end of each cluster of non-zero-valued coefficients.

Although quantized transform coefficient blocks more or less follow the above observations, there may exist some local "peculiar" variations in some part of the whole frequency region in each individual block. Were it not for such variations, the variable length coding methods would achieve higher coding efficiency.

Embodiments of the present invention include, for a first region coding method, the first region possible including the whole sequence, locally modifying the quantization process to eliminate some such peculiar local variations so as to decrease the number of events that need to be coded and to reduce the resulting coded bitstream length in a manner so as to only introduce minor, typically negligible distortion. We call such modifying of the quantized coefficients in localized cases "locally variable quantization."

In some embodiments, the coefficients are assumed to be already quantized by the fixed quantization method. In others, the quantization is included in the method.

For an ordered series of transform coefficients of a block of image data, the ordering from low to high spatial frequency according to a transform, and for the fixed quantization method that quantizes coefficient values of blocks of image data to quantized values that have amplitudes including a most likely-to-occur amplitude (0), a second-most likely-to-occur amplitude (1), and at least one other amplitude, including a third-most likely-to-occur amplitude (2), method embodiments of the invention include quantizing and encoding the ordered series to form a coded bitstream. The quantizing and encoding uses one or more variable length code (VLC) mappings. The quantizing includes quantizing to have amplitude-1 at least one coefficient that would be quantized by the fixed quantization method to have zero-amplitude, quantizing to have zero-amplitude at least one coefficient that would be quantized by the fixed quantization method to have amplitude-1, and using the fixed quantization method to quantize any coefficient that is quantized by the fixed quantization method not to have zero-amplitude, amplitude-1, or amplitude-2.

In the description herein, unless otherwise mentioned, assume that the ordered series of transform coefficients is already quantized by the fixed quantization method. A hybrid coding method includes defining one or more breakpoints to define two or more regions, e.g., two regions—a low-frequency region, and a high frequency region. Embodiments of the present invention include applying the locally variable quantization method to the first region coding method. The first region is the whole coefficient ordered series of an image block in the case of non-hybrid coding.

In some embodiments of hybrid coding, conventional 2-D variable length coding is used for encoding the second region.

Embodiments of the present invention include VLC methods in which the position of clusters, and the amplitudes of coefficients in the clusters are encoded by events that are defined, inter-alia, by the length of the cluster and, indirectly, the number of clusters. The fewer the clusters, the fewer positions that need be encoded. One locally variable quantization feature of the invention is locally modifying the quantized coefficients to reducing the number of clusters without significantly affecting the resulting error. One or more methods for so locally modifying the quantized coefficients from the values obtained from the fixed quantization method are described.

Some VLC methods include encoding three-dimensional joint position and amplitude event that may be followed by one or more one-dimensional (1-D) amplitude events for amplitudes that are not incorporated into the three-dimensional joint position and amplitude event. In the cases where the event inherently defines all non-zero-valued amplitudes, there are no non-zero amplitudes remaining to be encoded for the event s and therefore, there are no following one-dimensional amplitude events. The inventors observed that non-zero coefficients have smaller amplitudes as the frequency increases, such that non-zero coefficients tend to have amplitude 1 at the end of each cluster of non-zero coefficients. To take advantage of this, some embodiments of the present invention include encoding events that include the runlength of any trailing amplitude-1 coefficients. In particular, some embodiments include jointly encoding three-dimensional joint position and amplitude events that each includes a cluster of non-zero-valued quantized coefficients and a single zero-valued coefficient (unless the end of the sequence ends with a non-zero-valued coefficient) described by the numbers of preceding zeroes (if any), the numbers of non-zeroes in the cluster, and the number of consecutive trailing amplitude 1 coefficients at the end of the cluster preceding the final zero. Any other amplitude values are included in the one-dimensional amplitude event(s) that follow. A three-dimensional joint position and amplitude event can be represented by three quantities, Rz, Rnz and a quantity denoted T1, $T1 \leq Rnz$, representing the number of trailing coefficients in that cluster that have a amplitude of 1. The triplet (Rz, Rnz, T1) thus represents a three-dimensional joint position and amplitude event. As an example, a coefficient cluster: 0 0 0 6 2 1 1 1 0 is represented by the 3D position and amplitude event (3, 5, 3) with two remaining amplitudes 6 and 2 to be encoded. As another example, 0 0 0 6 1 2 1 1 0 is represented by the 3D position and amplitude event (3, 5, 2) with three remaining amplitudes 6, 1, and 2 to be encoded. The non-zero amplitude values other than the T1 trailing amplitude-1 coefficients are encoded in some embodiments by one-dimensional (1D) amplitude variable length coding in reverse order. That is, the first above example, the order of amplitude coding is coding amplitude 2 followed by coding amplitude 6, while in the latter example, the order is coding amplitudes 2 followed by 1 followed by 6.

In context adaptive coding, such as described in U.S. Ser. No. 12/336,364, multiple code mappings, e.g., VLC code tables are used for both 3D position-amplitude coding and 1D amplitude coding and the code mappings, e.g., VLC code tables are adaptively chosen based on the derivable context information from coded neighboring blocks or from the coded portion of the currently being coded block. One embodiment described in U.S. Ser. No. 12/336,364, three contexts are exploited in predicting the coefficient distribution and determining VLC tables: (1) the numbers of non-zero-valued coefficients in the neighboring blocks, which are used to predict the number of non-zero-valued coefficients in the present block; (2) the run-length of non-zero run and zero run of previously coded coefficient clusters in the current block; and (3) the magnitudes of previously coded non-zero-valued coefficients in each non-zero coefficient cluster, in the reverse order, of the current block.

In such embodiments of the present invention in which joint position and amplitude events are jointly encoded, locally variable quantization to increase the length of runs of trailing amplitude-1 coefficients may eliminate some of the additional amplitudes that need to be encoded, and hence reduce the number of codewords. One feature of the invention for such embodiments is locally modifying the quantized coefficients to reducing the number of non-amplitude-1 non-zero coefficient amplitudes that need to be encoded without significantly affecting the resulting distortion. This feature may be present with one or more methods of locally varying one or more quantized coefficients to decrease the number of clusters of non-zero coefficients without significantly affecting the resulting error.

In addition or as an alternate to reducing the number of joint position and amplitude events and additional amplitude values that need to be encoded, it would be advantageous that the events to be coded for each block could match the code table switch trend better by eliminating the local variations of the coding symbols in each block.

Different embodiments of the present invention include one or more of the following five locally varying quantization modifications.

Quantization Modification 1: Eliminating Isolated Small-Amplitude Non-Zero-Valued Coefficients.

By an isolated small-amplitude non-zero-valued coefficient is meant an amplitude-1 coefficient preceded and followed by one or more zero-valued coefficients. In such a case, it is known in the art to locally modify the quantization such that the isolated small-amplitude non-zero-valued coefficient is quantized to zero. Some embodiments of the invention include this feature denoted as Quantization Modification 1 herein. This would eliminate a cluster that includes the single non-zero-valued coefficient without introducing notable distortion. Note that some embodiments also eliminate a 0 1 sequence, called Quantization Modification 3 and some embodiments also eliminate a 1 0 sequence, called Quantization Modification 4. When one or both Quantization Modification 3 and Quantization Modification 4 are included, an isolated small-amplitude non-zero-valued coefficient is an amplitude-1 coefficient that is preceded by and followed by two or more zero-valued coefficients.

As an example of Quantization Modification 1, in the case of 3D position-amplitude coding, wherever an isolated amplitude-1 coefficient is eliminated, a single 3D position-amplitude event represents a much longer sequence of coefficients, and because the magnitude of the non-zero-valued coefficient was 1, the distortion introduced by quantizing the coefficient to zero will be small. For example, a coefficient block (6 3 1 0 0 0 1 0 0 0 2 1 0 . . . ) will be coded by three 3D position-amplitude symbols: (0, 3, 1), (2, 1, 1) and (2, 2, 1). If we quantize the isolated 1 to 0, however, the resultant coefficient block (6 3 1 0 0 0 0 0 0 2 1 0 . . . ) can be coded by only two 3D position-amplitude symbols: (0, 3, 1) and (6, 2, 1).

Quantization Modification 2: Eliminating Isolated Zero-Valued Coefficients

An isolated zero-valued coefficient is preceded and followed by a sequence of one or more non-zero-valued coefficients. Some embodiments of the invention include locally modifying the isolated zero-valued coefficient to a non-zero amplitude, say −1, for a negative coefficient that was otherwise quantized to 0, and +1 for a positive coefficient that was otherwise quantized to 0, such that the now amplitude-1 coefficient joins two clusters of non-zero-valued coefficients to form a longer cluster, without introducing notable distortion. We call this feature "Quantization Modification 2" herein. When one or both Quantization Modification 3 and Quantization Modification 4 are included, an isolated zero-valued coefficient is a zero-valued coefficient that is preceded by and followed by two or more non-zero-valued coefficients.

As an example of Quantization Modification 2, in the case of 3D position-amplitude coding, a coefficient block (8 5 3 −2 1 0 4 2 −1 0 0 0 . . . ) would be coded as two 3D position-amplitude symbols (0, 5, 1) and (0, 3, 1). Suppose the isolated zero-valued coefficient is positive, then varying the quantization such that the isolated zero-valued coefficient becomes 1, the resulting coefficient block (8 5 3 −2 1 1 4 2 −1 0 0 0 . . . ) is coded by only the single 3D position-amplitude symbol: (0, 9, 1).

Quantization Modification 2 of joining clusters of non-zero-valued coefficients that are separated by an isolated zero-valued coefficient is particular advantageous in hybrid coding methods that advantageously encode long runs of non-zero-valued coefficients in a first (low-frequency) region where non-zero-valued coefficients are likely to be clustered.

Quantization Modification 3: Replacing a 0 1 Amplitude Pair Preceded by a Sequence of Non-Zero-Valued Coefficients and Followed by One or More Zero-Valued Coefficients In some embodiments, a (0 1) amplitude pair preceded by a sequence of non-zero-valued coefficients and followed by one or more zero-valued coefficients is replaced either by (0 0) or (1 1) to reduce the number of events that need to be coded and to reduce the resulting coded bitstream length while introducing only a small amount of distortion. This is called Quantization Modification 3 herein. The codewords for the reduced events can be quite different depending on whether 0 0 or 1 1 is selected as the replacement for (0 1). The method includes examining the event sequences resulting from each of the two alternatives, and selecting the one which produces the shorter bitstream. In context adaptive cases, the method includes selecting the option which better matches the code mapping switching scheme, so that a shorter bitstream would result.

As an example, in the case of 3D position amplitude coding, the sequence 8 5 3 −2 1 0 1 0 0 0 0 5 3 −1 0 0 0 0 . . . would require three 3D position-amplitude symbols, to encode: (0,5, 1), (0,1,1) and (2, 3,1). Note that the 1 in the 0 1 0 is not regarded as an "isolated 1" because it is only preceded and followed by a single zero-valued coefficient, and Quantization Modification 3 of replacing a 0 1 is included.

Continuing with the example, there are two ways to reduce the number of code symbols. The first replaces (0 1) with (0 0) so that the sequence becomes 8 5 3 −2 1 0 0 0 0 0 5 3 −1 0 0 0 0 and is coded by the 3D position-amplitude symbols (0,5,1) and (4,3,1) while the second replaces (0 1) with (1 1) so that the sequence is 8 5 3 −2 1 1 1 0 0 0 5 3 −1 0 0 0 0 and is coded by the 3D position-amplitude symbols (0,7,3) and (2,3,1). The coding method includes examining the set of code sequences selecting and the set which better matches the code table switch scheme and thus results in a shorter coded bit string.

Note that this elimination of a (0 1) sequence preceded by a run of non-zero-valued coefficients and followed by a run of zero-valued coefficients is different than Quantization Modification 1 of removing an isolated amplitude-1 coefficient and is also different than Quantization Modification 2 of removing an isolated 0-valued coefficient.

Quantization Modification 4: Replacing a 1 0 Amplitude Pair Preceded by a Sequence of Zero-Valued Coefficients and Followed by One or More Non-Zero-Valued Coefficients In some embodiments of the invention, a (1 0) amplitude pair that is preceded by a sequence of one or more zero-valued coefficients and followed by one or more non-zero-valued coefficients with either (0 0) or (1 1). This is called Quantization Modification 4 herein. As in the case of Quantization Modification 3, the two alternatives each reduce the number of symbols that need to be encoded, but the resultant coding symbols and thus bit rate could be quite different. The coding method includes comparing the two different code symbol sequences resulted from the two alternate substitutions, and selecting the one that results in shorter coded bit string. For example, in the case of context adaptive coding, the method includes selecting the alternate that better matches with the code table switch scheme and thus results in shorter coded bit string.

As an example, in the case of 3D position amplitude coding, the sequence ( . . . 8 5 3 −2 1 0 0 0 1 0 5 3 −1 0 0 0 0 . . . ), which would without any of the herein described features normally require three 3D position-amplitude symbols to encode, can become the sequence ( . . . 8 5 3 −2 1 0 0 0 1 1 5 3 −1 0 0 0 0 . . . ) or the sequence ( . . . 8 5 3 −2 1 0 0 0 0 0 5 3 −1 0 0 0 0 . . . ). Encoding the first sequence includes encoding the events (0,5,1) and (2,5,1), while encoding the second sequence includes encoding the events (0,5,1) and (4,3,1). The resulting bit rate could be quite different for these two alternates. The method includes selecting the alternate that results in shorter coded bit string. For example, in the case of context adaptive coding, the method includes selecting the alternate that better matches with the code table switch scheme and thus results in shorter coded bit string.

Note that this elimination of a (1 0) sequence preceded by a run of non-zero-valued coefficients and followed by a run of zero-valued coefficients is different than Quantization Modification 1 of removing an isolated amplitude-1 coefficient and is also different than Quantization Modification 2 of removing an isolated 0-valued coefficient.

Quantization Modification 5: Replacing an Amplitude 2 Coefficient Adjacent to, e.g., Surrounded by Amplitude-1 Coefficients, or Followed by a Trailing Sequence of Amplitude-1 Coefficients Some embodiments of the invention include replacing an amplitude-2 coefficient—in general, the third-most likely-to-occur amplitude that is adjacent to a trailing run of amplitude-1 coefficients with an amplitude-1 coefficient. We call this feature Quantization Modification 5 herein. This feature is applicable to 3D position-amplitude coding and both extends the length of the run of trailing amplitude-1 coefficients, and eliminates the amplitude-2 1D amplitude event that needs to be coded, while only introducing minimal distortion. Two variations of Quantization Modification 5 are used in different embodiments. In a first embodiment, only an amplitude-2 coefficient that is preceded by at least one amplitude-1 coefficient and followed by a trailing sequence of amplitude-1 coefficients is replaced by an amplitude-1 coefficient. In a second embodiment, any single amplitude-2 coefficient that is followed by a trailing sequence of amplitude-1 coefficients is replaced by an amplitude-1 coefficient. In each of the embodiments, more coefficients can be encoded by the number of trailing amplitude-1 coefficients ($T_1$), so that fewer coefficients need to be encoded by the additional 1D amplitude coding.

As an example, consider a coefficient block (8 5 3 −2 1 1 2 −1 1 0 0 0 2 1 −1 0 0 0 . . . ) that before any of the local variations of quantization are applied would be coded by a first 3D position-amplitude symbol (0, 9, 2) and seven additional 1D amplitude coding for the remaining amplitude (8 5 3 2 1 1 2) preceding the trailing-1's, and by a second 3D position-amplitude symbol (2, 3, 2) and one additional 1D amplitude coding for the remaining amplitude (2) preceding the trailing-1's. In a first version of applying Quantization Modification 5, the coefficient block becomes (8 5 3 −2 1 1 1 −1 1 0 0 0 2 1 −1 0 0 0 . . . ) which is coded by a first 3D position-amplitude symbol (0, 9, 5) and four additional 1D amplitude coding for the remaining amplitude (8 5 3 2) preceding the trailing-1's, and by a second 3D position-amplitude symbol (2, 3, 2) and one additional 1D amplitude coding for the remaining amplitude (2) preceding the trailing-1's. Therefore, several 1D amplitude codewords are eliminated. In a second version of applying Quantization Modification 5, the coefficient block becomes (8 5 3 −1 1 1 1 −1 1 0 0 0 1 1 −1 0 0 0 . . . ) which is coded by a first 3D position-amplitude symbol (0, 9, 6) and three additional 1D amplitude coding for the remaining amplitude (8 5 3) preceding the trailing-1 's, and by a second 3D position-amplitude symbol (2, 3, 3) and no additional 1D amplitude coding. Therefore, even more 1D amplitude codewords are eliminated.

When such local varying of the quantization is applied to a context adaptive coding method, such as context adaptive hybrid VLC, in addition to the eliminating of 1D codewords, the amplitude of all the remaining non-zero-valued coefficients could also be adjusted to better match with the amplitude code table switch.

Hybrid Coding

The locally variable quantization methods described above are applied in a first region of an ordered sequence of transform coefficients of an image block. In the case of non-hybrid coding, the first region is the only region, i.e., the whole sequence. In hybrid coding, at least one breakpoint is defined that divides the sequence to at least a first low-frequency and a second high-frequency region. Non-hybrid case is included in such a description; the first region is the whole region. In some embodiments of hybrid coding, the breakpoint defining the first low-frequency and the second high-frequency region is a hard breakpoint that does not vary. In other embodiments of hybrid coding, the breakpoint defining the first low-frequency and the second high-frequency region is a "soft" breakpoint in that such a breakpoint does not break-up the final event in the first region. So in the case of 3D position-amplitude coding, the actual start of the second region is at the end of the last 3D position-amplitude event in the first region that starts before the position value of the soft breakpoint. Therefore, if the last first region 3D position-amplitude event ends at exactly the position value of the soft breakpoint, such value is the location of the start of the second region, otherwise, the location of the start of the second region is after the value of the soft breakpoint and at the end of the last 3D position-amplitude event.

Alternate Versions of 3D Position-Amplitude Coding

In some embodiments, there is one exception included to the above definition of encoding clusters by encoding 3D position-amplitude events—the case of Rnz=1, an isolated non-zero coefficient. When variable quantization is included, an isolated amplitude-1 coefficient is excluded. Furthermore, the inventors chose in cases that have a non-zero non-amplitude-1 isolated coefficient to define the third parameter in the 3D position-amplitude event by the amplitude of the non-zero coefficient rather than by T1 the number of trailing 1's, which in this case can only be 0 or 1. Thus, whenever Rnz=1, the coding method understands that in an event (Rz, 1, x), x is the amplitude of the non-zero coefficient.

In some embodiments of the invention, one other exception was added to the above definition of encoding clusters by encoding 3D position-amplitude events—the case of Rnz=2. For such other exception, the third parameter, denoted x, rather than indicating the number of trailing amplitude-1 coefficients, indicates which of the two non-zero coefficients have an amplitude of 1, in a manner shown in FIG. 1, which shows Table 1 of the value of x for different patterns for the event (Rz, 2, x), where 'x' stands for a non-1 quantized amplitude.

In some embodiments of the invention, for the case of Rnz>1, the quantized amplitudes other than those that are indicated by the 'x' event in the three-dimensional joint position and amplitude event are coded by a one-dimensional amplitude code applied in a reverse (decreasing spatial frequency) scan order to the forward, e.g., forward zigzag scan order. In other words, the coding starts from the last non amplitude 1 in the cluster and moves toward the lower frequency non-zero amplitude.

In a variant of the 1D amplitude coding of the non-zero, non-amplitude-1 coefficients in the cluster, the last non-zero, non-amplitude-1 coefficient in the cluster is coded as the amplitude minus 1 to further shorten the codeword (on average over all possible images) since the last non-zero, non-amplitude-1 coefficient must be larger than 1 otherwise it would be indicated by the T1 parameter of the 3D position-amplitude event.

In some embodiments, for each cluster, each of the three-dimensional joint position and amplitude events and any associated one-dimensional amplitude events are each assigned a codeword to achieve compression such that, on average over all possible images, the more likely-to-occur an event is, the shorter codeword used to encode the event. The coding maps events to codewords. In some embodiments, the mappings of events to codewords are defined by variable length code (VLC) mappings. Embodiments of the invention include variable length code mappings in which, on average over all possible images, e.g., over a large number of images that are typical, a shorter code is used for an event that is more likely-to-occur than for an event that is less likely-to-occur. Thus VLC mappings are based on statistics of events. These statistics may be pre-determined according to typically occurring images, or may be adaptively determined from the image data. Note that when locally variable quantization is included, the statistics assume that the locally variable quantization is used.

Each VLC mapping can be represented by a table. Thus, throughout this description, the term "table" should be understood to include not just a table, but broadly any form of VLC mapping that provides the codeword for the event being coded. Furthermore, as is common in the art, some events that typically are not very likely-to-occur are encoded by a fixed codeword plus some escape code to indicate that a fixed length codeword is being used. This provides for a smaller code mapping.

In addition to the quantized amplitudes, the signs of the quantized coefficients also are coded according to some sign coding method. Alternatively, the sign may be incorporated into the code mappings.

Thus, the mapping for a single cluster is according to a three-dimensional table for three-dimensional joint position and amplitude coding and a one-dimensional table for each one dimensional amplitude event, if any, to be coded for the cluster.

Context Adaptation

Some embodiments of coding include context adaptation. Instead of using a single 3-D VLC mapping and possibly one or more 1-D VLC code mappings for encoding each cluster, embodiments of the present invention use sets of VLC mappings, and include switching between the code mappings based on one or more context-based selection criteria, wherein by a context-based criterion is meant a criterion that during encoding is known or derivable from one or more previously encoded items of information. Context is thus based on one or more properties of previously coded coefficients that are related to where the coding occurs within the block being coded and/or to one or more properties related to already coded image blocks surrounding the block being coded. Either the position coding or the amplitude coding or both the position coding and the amplitude coding can include VLC mapping switching. Hence, one embodiment includes two sets of VLC mappings: one for position coding, and the second for amplitude coding.

Each of the sets of VLC tables is designed to provide best compression for coefficients that follow a certain statistical distribution. With thus designed multiple sets of VLC tables, compression of the coefficient sequence may be improved by predicting the distribution of next to-be-coded coefficients based on information derivable from previously coded coefficients, and coding the next to-be-coded coefficients using the corresponding VLC tables. The information derivable from previously coded coefficients is called context herein.

In some embodiments of what we call Context Adaptive Hybrid Variable Length Coding (CAHVLC), in which clusters positions are encoded, e.g., by one of a set of multidimensional position VLC mappings, and remaining to-be-encoded amplitudes are encoded by one of a set of VLC amplitude mappings, for contexts are exploited in predicting the coefficient distribution and determining VLC tables. These are:

Context 1: the Cluster Sizes in Nearby Block(s)

The first context includes an indication of the number of non-zero quantized coefficients in clusters in at least one previously encoded neighboring block, e.g., the average number of non-zero quantized coefficients clusters in one or more previously encoded neighboring blocks. In some embodiments, these numbers are used to predict the number of non-zero coefficients in clusters in the presently being coded block. Some embodiments including encoding the quantized coefficients of blocks of an image block row by block row in a top to bottom order, and encoding the blocks within a row block by block from left to right. In one such embodiment, the number of non-zero coefficients in the next to-be-coded block—called the currently being coded block and also the current block, such a block denoted X, is predicted by the average number of non-zero coefficients in neighboring already encountered, e.g., already coded blocks. In some embodiments, the quantity used to predict the number of non-zero coefficients in clusters in the current block X included the average number of non-zero coefficients in the clusters in the block above X denoted block A, and in the block to the left of block X, block B. FIG. 2 shows the block X and its already coded neighboring blocks A and B.

In alternate embodiments, a weighed average of the number of non-zero coefficients in clusters of neighboring already encountered blocks is used. Again referring to FIG. 2, previously coded blocks C and D that are diagonally above and to the left of X, and diagonally above and to the right of X also are included.

Contexts 2 and 3: the Sizes of Clusters and how Sparse are the Clusters within the Block The second and third contexts include the sizes of neighboring clusters and how sparse such clusters are as indicated by the run lengths of consecutive zero-valued quantized coefficients preceding neighboring non-zero quantized coefficient clusters. In some embodiments, the distribution of the run-length of non-zero quantized coefficients of the next to-be-coded quantized coefficient cluster is predicted by the run-length of non-zero quantized coefficients of the most recently coded cluster(s) in the block. Furthermore, the distribution of the run-length of zero-valued quantized coefficients preceding the next to-be-coded coefficient cluster is predicted by the maximum run-length of zeros among all the previously coded clusters in the block, assuming a typical zigzag scan ordering of quantized transform coefficients.

Context 4: the Amplitudes within the Clusters

The fourth context includes the amplitudes of previously coded non-zero quantized coefficients within the cluster of non-zero amplitudes being coded. Assume again the normal forward zigzag ordering of quantized coefficients towards higher spatial frequencies as defined by the particular transform used, and consider a reverse ordering thereof. In some embodiments, the amplitudes of non-zero coefficients in a cluster are coded in a reverse zigzag scan order, and the distribution of amplitudes of the remaining to be coded amplitudes in a particular cluster is predicted by the maximum amplitude of the previously coded non-zero coefficients in that cluster.

Method of Coding a Sequence of Quantized Coefficients

Figure 3:
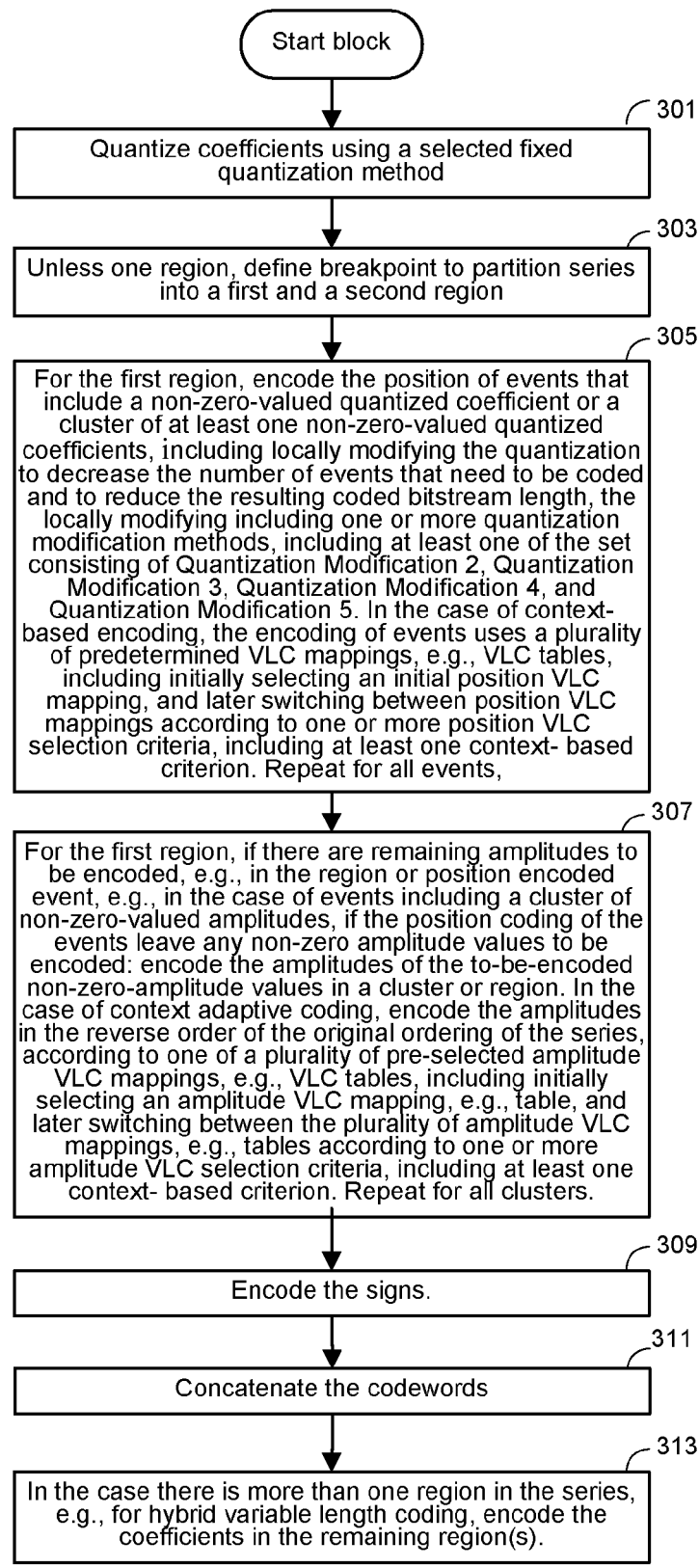
FIG. 3 shows a simplified flowchart of a method embodiment of coding an ordered sequence of quantized coefficients of an image block.

FIG. 3 shows a simplified flow chart of a method embodiment of coding an ordered sequence of transform coefficients of an image block, e.g., a method of operating a coding apparatus, e.g., a processing system to code the ordered sequence.

Step 301 includes quantizing the coefficients according to a fixed quantization method, e.g., that of H.264/AVC. If step 301 is not explicitly included in some descriptions herein, it may be assumed that the transform coefficients are already quantized according to the fixed quantization method.

In some embodiments, the method is a hybrid coding method and includes in 303 selecting a breakpoint to partition the series into a first region and a second region. The first region may be the whole sequence, i.e., in some embodiments, only a single region is included.

In 305, for the first region—the whole region if not hybrid or the breakpoint is at the end—the method includes encoding the position of events, each including a non-zero-valued quantized coefficient or, for some embodiments, including a cluster of one or more non-zero-valued quantized coefficients. The encoding includes locally modifying the quantization to decrease the number of events that need to be coded and to reduce the resulting coded bitstream length without significantly increasing the distortion, the locally modifying including one or more quantization modification methods, including at least one of the set consisting of Quantization Modification 2, Quantization Modification 3, Quantization Modification 4, and Quantization Modification 5.

Note that if Quantization Modification 1 is included, there are at least two quantization modification methods included.

In the case of context adaptive VLC coding, the encoding uses one of a plurality of predetermined VLC mappings such as VLC tables, including initially selecting an initial position VLC mapping, e.g., VLC table from the set of predetermined VLC mappings, and when not the initial case, determining whether to switch code mappings and switching between position VLC mappings, e.g., tables according to one or more position VLC selection criteria, including at least one context-based selection criterion. Step 305 is carried out for all events in the first region.

In 307, for the first region, if there are remaining amplitudes to be encoded in the region, of, if step 307 is carried out before all position coding for all events has occurred, if there are remaining amplitudes to be encoded in the encoded event, e.g., in the case of events including a cluster of non-zero-valued amplitudes, if the position coding of the events leave any non-zero amplitude values to be encoded, encoding the amplitudes of the to-be-encoded non-zero-values. This can be done event by event, or in some embodiments, after all position encodings of all events have occurred. In come context-adaptive embodiments, the amplitude encoding of to-be-encoded amplitudes in a cluster is carried out in the reverse order of the original ordering of the series, and is according to one of a plurality of amplitude VLC mappings, e.g., VLC tables, including initially selecting an amplitude VLC mapping, e.g., table, and thereafter switching between the plurality of amplitude VLC mappings, e.g., tables according to one or more amplitude VLC selection criteria, including at least one context-based criterion; repeat for all to-be-encoded amplitudes. Step 307 thus encoded all events in the first region whose positions are encoded in step 305.

In 309, the method includes encoding the signs of the non-0 amplitudes.

In 311, the method includes concatenating the codewords to form a coded bitstream and outputting or storing the bitstream.

If the method includes defining one or more breakpoints to define two or more regions, e.g., two regions, the method includes in 313 to encode the coefficients in the remaining region(s). In some embodiments, conventional 2-D variable length coding is used for encoding the second region.

Different embodiments include different position and different amplitude coding methods. The coding methods may be context adaptive.

Note that those embodiments that include Quantization Modification 1 also include at least one other modification method.

Figure 4:
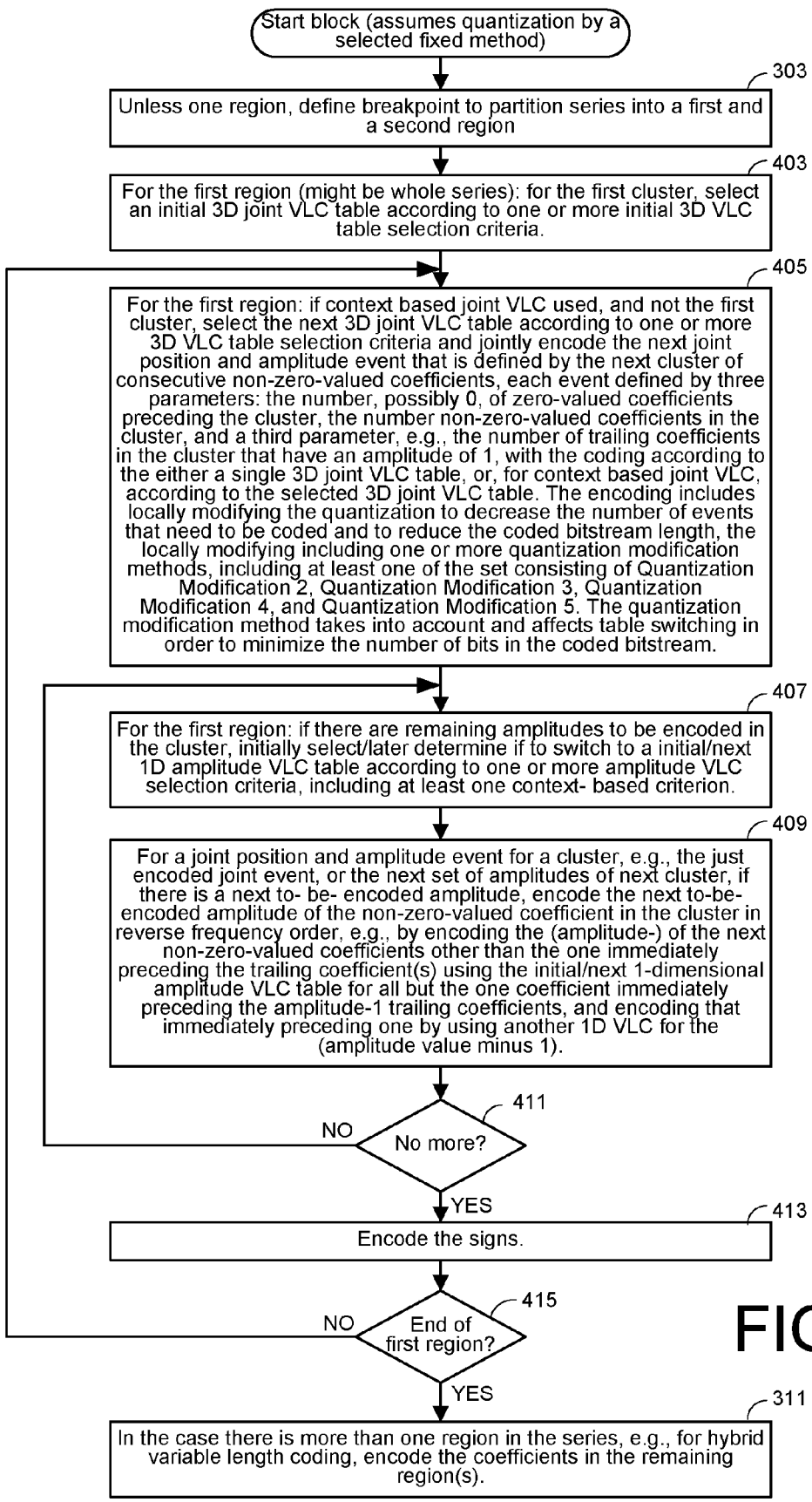
FIG. 4 shows a simplified flowchart of some embodiments of context adaptive coding that include position mapping using a plurality of three-dimensional position VLC mappings, with context based switching of the tables.

FIG. 4 shows a simplified flowchart of some embodiments that include encoding 3D position-amplitude events using a plurality of three-dimensional position VLC mappings, with context based switching of the tables, and with locally modifying the quantization in order to reduce the number of events to be coded and to reduce the resulting coded bitstream length without significantly increasing the distortion.

The method includes, in the case of hybrid coding, step 303 of selecting a breakpoint to partition the series into a first region and a second region. The first region may be the whole region.

The method includes in 403 initially selecting a three-dimensional VLC mapping, e.g., 3-D VLC table to use for the first cluster using one or more 3-D VLC table selection criteria. Consider the codewords being formed from a particular block of image data. In one embodiment, initially, step 403 includes selecting an initial 3D VLC table according to one or more initial VLC selection criteria. In some embodiments, the initial VLC table is selected based on one or more initial position criteria, including the average number of non-zero coefficients in one or more previously encoded blocks that are neighbors to the particular block, i.e., based on the first above-described context. In alternate embodiments, one or more alternate or additional other coding parameters are used to select the first table. Such other coding parameters include one or more of a quantization step size, e.g., quantization parameter denoted QP, and/or whether the particular block is an intra-coded block or an inter-coded block.

The method includes in 405, if not the first cluster, and a context based method, ascertaining whether to switch tables and selecting the next a three-dimensional VLC mapping, e.g., 3-D VLC table to use for the next cluster according to one or more 3D VLC table selection criteria, and jointly encoding, according to the three-dimensional VLC mapping, a three-dimensional joint position and amplitude event that includes a cluster of non-zero-valued quantized coefficients and a single ending zero-valued coefficient—unless the end of the sequence ends with a non-zero-valued coefficient—described by a set of three parameters including: 1) the number, which can be zero, of preceding consecutive zero-valued quantized coefficients preceding the cluster, 2) the numbers of non-zero-valued quantized coefficients in the cluster, and 3) a third parameter that for some embodiments, in some cases indicates the number of consecutive trailing amplitude-one quantized coefficients at the end of the cluster preceding the final zero-valued quantized coefficient of the cluster. In some embodiments, in the case there is only one non-zero amplitude in the cluster, the third parameter indicates the amplitude of the non-zero-amplitude coefficient. In some embodiments, in the case that there are two non-zero amplitude coefficients in the cluster, the third parameter is indicative of which if any of the two non-zero amplitude coefficients in the cluster have an amplitude other than 1.

The encoding in 405 includes locally modifying the quantization to decrease the number of events that need to be coded and to reduce the resulting coded bitstream length without significantly increasing the distortion, the locally modifying including one or more quantization modification methods, including at least one of the set consisting of Quantization Modification 2, Quantization Modification 3, Quantization Modification 4, and Quantization Modification 5. The locally modifying and hence the encoding takes into account, and also therefore affects the table switching in order to reduce the number of bits in the coded bitstream.

Note that if Quantization Modification 1 is included, there are at least two quantization modification methods included.

Other than initially, step 405 that includes selecting the next 3-D VLC mapping, e.g., coding table occurs after coding a current coefficient cluster and before coding the next cluster. In some embodiments, the 3-D VLC mapping selection criteria include one or both of two context-based parameters: the run-length of non-zero coefficient of the recently coded cluster, i.e., the second above-described context, and/or the maximum run-length of zero coefficients of all previously coded clusters, i.e., the third above-described context. In some embodiments, a table switch is considered when the value of either of the context-based parameters changes, and a decision to switch is according to a pre-defined change detection criterion, e.g., using thresholds for each context-based parameter.

FIG. 5 shows one example of threshold based selection of 3-D VLC tables presented as Table 2 that shows how the method selects one of 36 VLC tables denoted $VLC_{qr}$, where integers $q, r=0, 1, \ldots, 5$ for three-dimensional joint position and amplitude coding according to where two contexts are in relation to two pre-defined 3D table switching thresholds: a maximum zero run-length of previous cluster threshold, denoted $z_i$, where $i=1, 2, \ldots, 5$ and a non-zero run-length of the recent cluster Rnz_pre threshold denoted $n_j$, where $j=1, 2, \ldots, 5$, where $0<z_i<z_j<63$, and $1<n_i<n_j<64$, for $i<j$.

In some embodiments, the 3D VLC table switching is restrained to a monochrome direction from the top-left to the bottom-right. In other words, a table switch occurs when either Rz_max increases or Rnz_pre decreases and the value falls into a new range according to the thresholds. In other embodiments, the 2-dimensional table switch shown in FIG. 5 is restrained to at most one-step from left to right each time based on the non-zero run-length parameter while multiple steps from top to bottom each time is allowed based on the zero run-length parameter.

In the case there are amplitudes remaining to be coded for the cluster, in the case of context sensitive amplitude coding of the remaining coefficients, the method includes in 407 selecting an initial 1-D amplitude VLC mapping, e.g., 1-D VLC table according to one or more initial amplitude VLC selection criteria, including at least one context-based criterion. The selection is in some embodiments from a set of pre-determined 1-D VLC tables. In some embodiments, the initial one-dimensional amplitude VLC table is determined based on the coded trailing-1 event and the spatial frequency region where the coefficient cluster falls. Intuitively, a VLC table that favors larger amplitudes is more likely to be a good choice in the low-frequency region than a VLC table that favors a lower amplitude in the low frequency region, even though in general, lower amplitude values are more likely-to-occur after quantization.

In 409, the method includes encoding the next (initially the first) still to be encoded amplitude in the cluster in reverse frequency order, that is, encoding the next amplitude of any non-zero-valued coefficient in the cluster that are not encoded by the joint event encoding, e.g., encoding the next to-be-encoded non-zero-valued coefficient in the cluster that is not an amplitude 1 trailing coefficients. In some embodiments, this is carried out by encoding the next to-be-encoded coefficient in the cluster, other than the one immediately preceding the amplitude 1 trailing coefficients, as its amplitude using a 1-dimensional amplitude VLC table, and encoding that immediately preceding one by using another 1-D VLC for the (amplitude value minus 1).

For context based amplitude VLC, the next to-be-encoded amplitude is according to initially the initial amplitude VLC table, and thereafter the next selected amplitude VLC table. If there is at least one more amplitude to be encoded (413), the method returns to 407 wherein it is determined if there should be a table switch to a different 1-D amplitude VLC table. If so, the new table is selected.

Steps 407, 409, and 411 (or 409 and 411 if the amplitude encoding is not context adaptive) of the cluster and proceeds toward the first amplitude of the cluster in the reverse ordering to the original ordering of the series. Encoding (amplitude minus 1) for the one coefficient immediately preceding the amplitude 1 trailing coefficients can reduce the code length, since it is known that it is greater than 1.

In some embodiments, the context used for determining whether to switch tables is based on one or more VLC mapping selection criteria. In some embodiments, the VLC mapping selection criteria include the amplitude of the previously coded coefficient. In other embodiments, the criteria include the maximum of all previously coded coefficients in the cluster, i.e., the third above-described context. One embodiment includes defining a set of one-dimensional amplitude coding tables, one for each of a corresponding set of ranges for the maximum value of the previously coded amplitudes in the cluster, based on a set of pre-determined thresholds.

In step 409, initially with the selected initial table, one-dimensional amplitude coding begins with coding the last non-1 amplitude of the cluster, as (amplitude minus 1), and proceeds toward the first amplitude of the cluster in the reverse ordering from lowest to highest spatial frequency, e.g., in the reverse to the zigzag scan order used for the two-dimensional block of transform coefficients.

After all the amplitudes of the cluster have been encoded, in 413, the signs of the non-0 amplitudes are encoded. Flow-chart elements 403 to 413 are carried out for all clusters in the first region (415).

If the method includes defining one or more breakpoints to define two or more regions, e.g., two regions, the method proceeds in 413 to encode the coefficients in the remaining region(s). In some embodiments, conventional 2-D variable length coding is used for encoding the second region.

The method includes concatenating the codewords to form a coded bitstream, and outputting or storing the bitstream.

In an alternate embodiment, the third parameter defining events for the three-dimensional encoding includes, for at least one cluster length, e.g., a cluster length of 2, an indication of which of the coefficients in the cluster have amplitude 1. In yet another embodiment, in the case the cluster length is 1, the third parameter includes an indication of the amplitude of the one non-0 quantized amplitude. How to modify the method described above and in FIG. 4 to so accommodate such 3-D encoding would be clear to one in the art, and is described in more detail, without the context-based VLC table switching, in U.S. Ser. No. 12/030,821.

Figure 6:
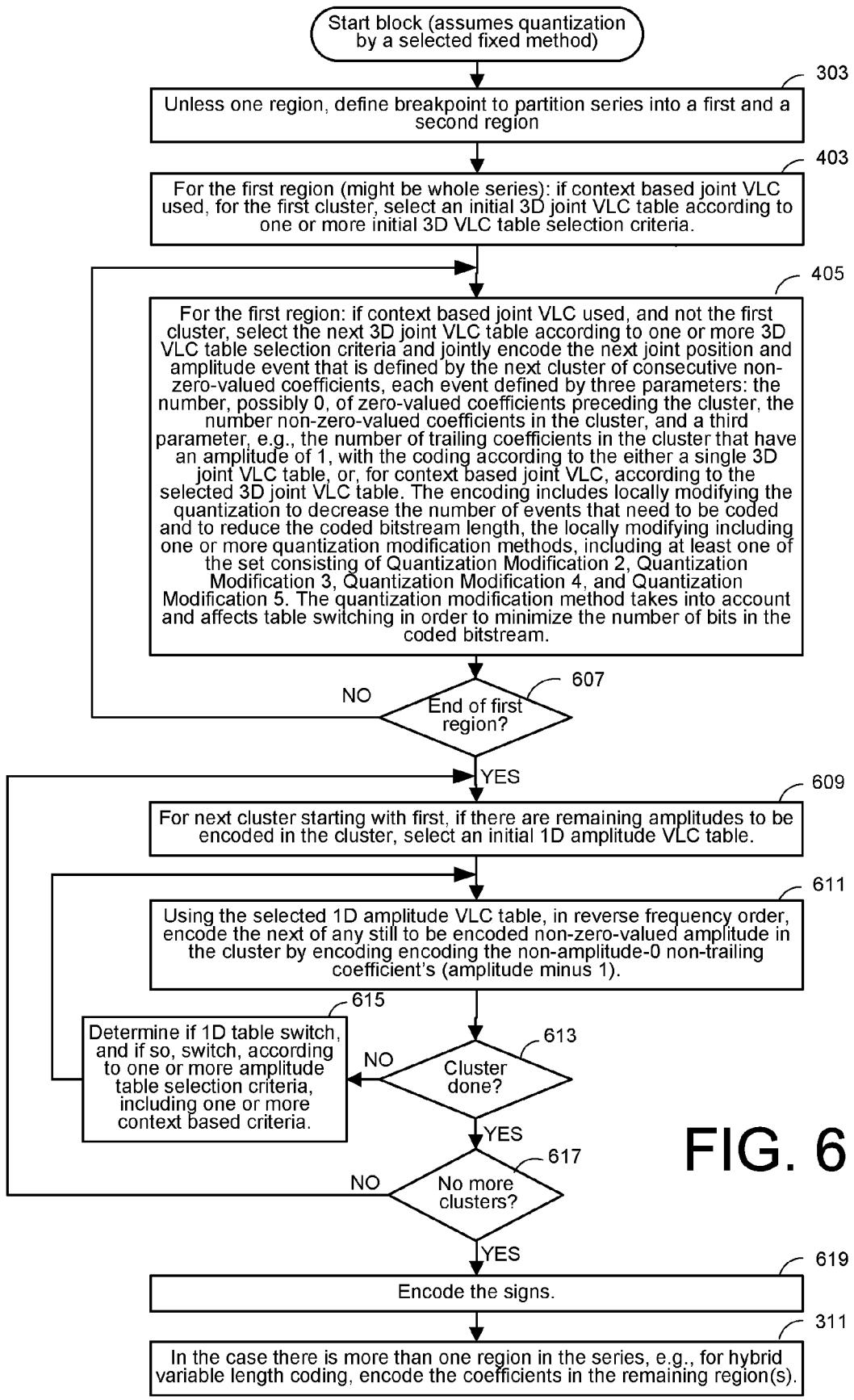
FIG. 6 shows a simplified flowchart of an embodiment of context adaptive coding that includes carrying out amplitude coding after the positions of all clusters have been coded.

Note that, because the coding of remaining amplitudes is independent of the position coding process and is performed for each coefficient cluster separately, it may be carried out either immediately following the position coding of a cluster, as shown in the flowchart of FIG. 4, or in alternate embodiments, after the positions of all coefficient clusters are coded. FIG. 6 shows a simplified flowchart of one such embodiment that includes carrying out the amplitude coding after the positions of all clusters have been coded. Step 607 proceeds until the position coding of all clusters occurs—in the first region if hybrid coding with multiple regions. See the end of first region decision 607 and the looping back. A cluster loop including flowchart elements 609, 611, 613, 615 and 617 is repeated for each cluster in the first region to encode all the remaining to-be-encoded amplitudes in the cluster until no more clusters are encountered. Such a loop includes an individual amplitude encoding loop including flowchart blocks 611, 613, and 615. One-dimensional amplitude coding begins with coding the last non-1 amplitude of the cluster as (amplitude minus 1), and proceeds toward the first amplitude of the cluster in the reverse ordering from highest to lowest spatial frequency, e.g., in the reverse to the zigzag scan order used for the two-dimensional block of transform coefficients.

Such embodiments that first complete position coding have the advantage of providing another possible context to use for determining if to switch tables: the distribution of all quantized coefficients in the ordered series of the block. For example, if there are a large number of non-zero quantized coefficients in the ordered series, intuitively, there is a higher probability of having relatively large amplitudes in the first few coefficient clusters. One method selects the initial amplitude VLC using this context. The inventors found that this can provide better performance than carrying out the initial table selection after the initial cluster is encoded.

Assuming context adaptive amplitude coding, in 609, for the next cluster, initially the first cluster, if there are non-1 amplitudes remaining to be encoded, an initial 1-D amplitude VLC table is selected according to an initial 1-D table selection criterion, e.g., the spatial frequency position of the cluster. In 611, the next amplitude for the next cluster is encoded using the last selected—initially the first—1-D amplitude VLC table. After encoding each amplitude, if there are more amplitudes to be encoded (613) a table switch decision is made in 615 based on one or more VLC mapping selection criteria. In some embodiments, the VLC mapping selection criteria include the amplitude of the previously coded coefficient. In other embodiments, the criteria include the maximum of all previously coded coefficients. One embodiment includes defining a set of one-dimensional amplitude coding tables, one for each of a corresponding set of ranges for the maximum value of the previously coded amplitudes based on a set of pre-determined thresholds.

The method proceeds then to encode the next to-be encoded amplitude.

As in the case of FIG. 4, in 619, the signs of the non-0 amplitudes in the first region are encoded. If the method includes defining one or more breakpoints to define two or more regions, e.g., two regions, the method proceeds in 313 to encode the coefficients in the remaining region(s). In some embodiments, conventional 2-D variable length coding is used for encoding the second region.

The method includes concatenating the codewords to form a coded bitstream and outputting or storing the bitstream.

It should be noted that the context adaptive position coding process, e.g., 405 of FIG. 4, and the context adaptive amplitude coding processes, e.g., 407/409 of FIG. 4 are separable and may each be adopted in conjunction with other similar methods. More particularly, context adaptive one-dimensional amplitude VLC as described herein, e.g., in FIGS. 4 and 6 may be combined with a different position coding scheme, e.g., the one-dimensional, two-way position coding scheme described in incorporated by reference Application U.S. Ser. No. 12/016,441, or the 2-D context adaptive method described in incorporated by reference Application U.S. Ser. No. 12/016,441. Alternatively, the 3-D context adaptive position coding method described herein, e.g., in FIGS. 4 and 6 may be combined with a different amplitude coding scheme, e.g., the multi-dimensional context adaptive amplitude coding method described in incorporated by reference Application U.S. Ser. No. 12/016,441. Each such different implementation has different coding performance and computation requirements.

Also note that the 3D position-amplitude event encoding includes ascertaining whether to switch tables and selecting the next 3D VLC table to use if switching. The quantization modification method takes into account and affects table switching in order to minimize the number of bits in the coded bitstream.

Consider one such example of using a different context adaptive position coding method—using one-dimensional, two-way position coding. Some 1-D position coding embodiments follow the convention of coding the position of each non-zero-valued coefficient according to the number, of any, of consecutive zero-valued coefficients that precede the non-zero-valued coefficient, such a number possibly 0. This parameter is denoted Run_z herein. In some embodiments, two components that relate to context information are included. The first included context component is the maximum value of Run_z of previously coded non-zero amplitude quantized coefficients. The second included context component is an index indicative of the present frequency—in the form of a present frequency sub-band index in the case that the range of spatial frequencies of the transform is broken up into frequency sub-bands, each represented by an index value. This indicates "where we are" during the position coding process. Combining these two context components provides a prediction of the variation tendency of the coefficient positions. One embodiment of the coding method ascertains whether or not to switch the VLC table based on such prediction.

FIG. 7 shows Table 3 that illustrates by way of example, how in one embodiment a VLC table is selected based upon the previous maximum run of zero-valued quantized coefficients preceding a non-zero-value (Run_z) and the present frequency index components. In FIG. 7, VLCpk, k=0, 1, 2, . . . denotes a particular VLC table for position coding and Ix, Ry denote the respective selected thresholds for the frequency index and previous maximum Run_z, respectively. Each VLCp table is a one-dimensional code mapping, e.g., code table in which each value of Run is assigned a variable length codeword.

Consider another example of using a different context adaptive amplitude coding method, e.g., the multi-category amplitude coding method disclosed in incorporated by reference Application U.S. Ser. No. 12/016,441. For this, use is made of the fact that after the positions of all quantized coefficients are coded, the distribution of non-zero-valued coefficients in the coefficient series is known. This knowledge provides context information for coding the quantized amplitudes (Levels) of the non-zero-valued coefficients. To use this context, Levels are divided into three categories: If a non-zero-valued coefficient is preceded and followed by zero-valued coefficients or preceded by a zero and the final quantized coefficient, it is categorized as what we call an "isolated" Level; if a non-zero-valued quantized coefficient is preceded or followed by a zero-valued quantized coefficient but not both, it is categorized as what we call an "adjacent-to-0" Level. The third category is neither an isolated Level nor an adjacent-to-0 Level. The inventors noticed that in many ordered series, an isolated or adjacent-to-0 Level is more likely to have a small magnitude, while a non-zero-valued coefficient that is preceded and is followed by a non-zero-valued coefficient is more likely to have a larger magnitude.

Corresponding to the three categories, one embodiment of context adaptive amplitude coding of remaining to be coded amplitudes includes three phases. In the first phase, all isolated to-be-coded Levels are extracted and concatenated. Following the reverse scan order, the concatenated Level series is coded by a 3D VLC method in which every consecutive three Levels is coded as a 3-tuple using one codeword. The remaining one or two isolated Levels are coded in a second phase, together with all adjacent-to-0 Levels and following the reverse order of the series to the original increasing frequency, e.g., zigzag ordering. In such a phase, every consecutive two Levels is coded using a 2D VLC method, and, if there exists any last (one) Level, such a last Level is coded in the third phase together with all the remaining Levels, using a 1D VLC method. Within each phase, multiple VLC tables are used, and the determination of a particular VLC is in one embodiment based on the maximum magnitude of those Levels that have higher frequency indices and that have been previously coded.

Figure 8:
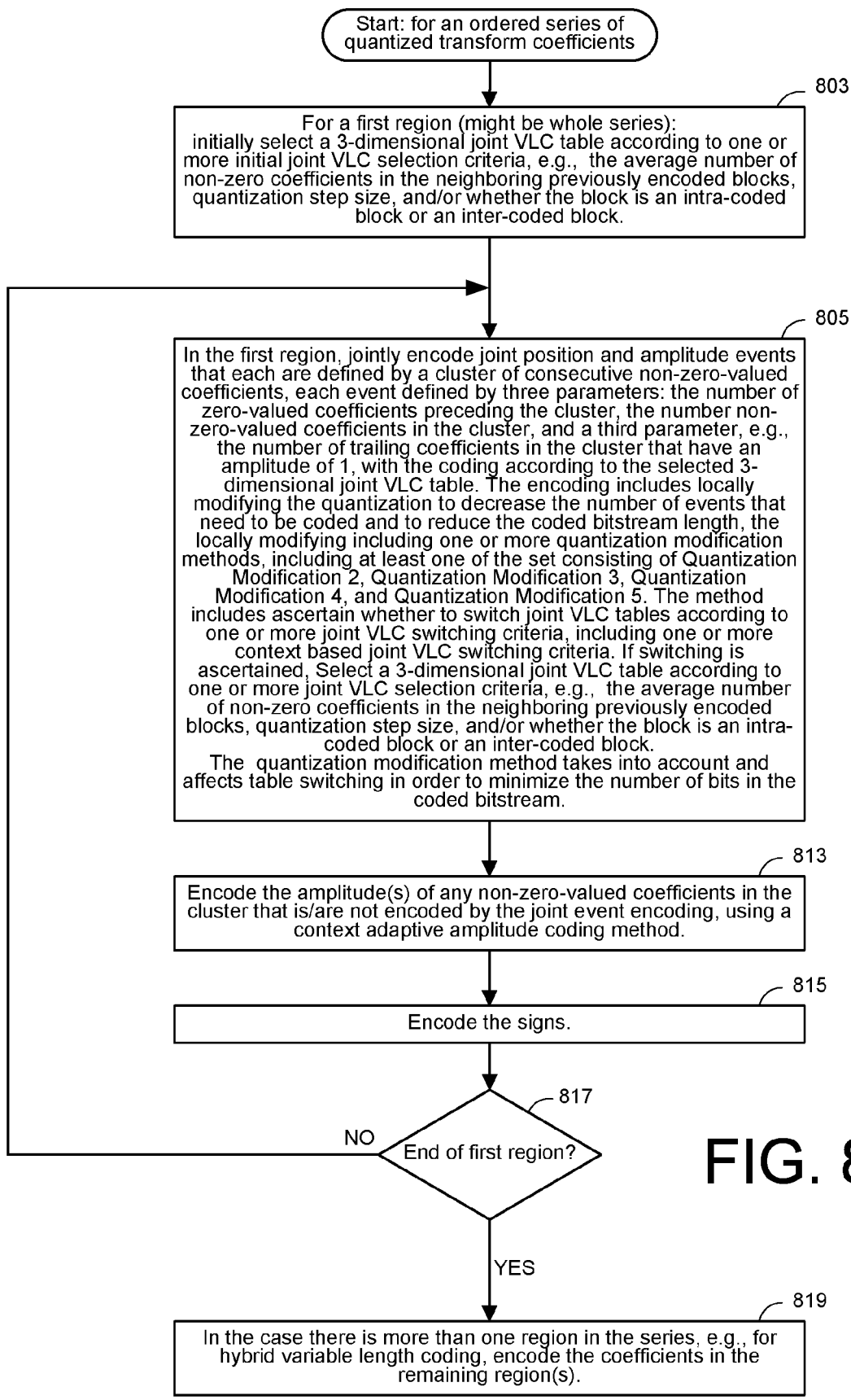
FIG. 8 shows a flowchart of one example of an alternate method embodiment of encoding.

FIG. 8 shows a flowchart of one example of an alternate method embodiment of encoding. Some of the reference numerals used in FIG. 8 might refer to steps that in other drawings have different reference numerals. The method is to encode an ordered series of quantized transform coefficients. Step 803 occurs the first time for a first region (might be whole series) of the series and includes initially selecting a 3-dimensional joint VLC table according to one or more initial joint VLC selection criteria, e.g., the average number of non-zero coefficients in the neighboring previously encoded blocks, quantization step size, and/or whether the image block from where the series is determined is an intra-coded block or an inter-coded block. 805, 813, 815 and 817 are repeated until no more coefficients in the first region need be encoded. The method includes in 805 in the first region, jointly encoding joint position and amplitude events that each are defined by a cluster of consecutive non-zero-valued coefficients. Each event is defined by three parameters: the number of zero-valued coefficients preceding the cluster, the number of non-zero-valued coefficients in the cluster, and a third parameter, e.g., the number of trailing coefficients in the cluster that have an amplitude of 1, with the coding according to the selected 3-dimensional joint VLC table. The encoding in 805 includes in ascertaining whether to switch the joint VLC table according to one or more joint VLC switching criteria, including one or more context based joint VLC switching criteria. If it is ascertained to switch tables, a 3-dimensional joint VLC table is selected according to one or more joint VLC selection criteria, e.g., the average number of non-zero coefficients in the neighboring previously encoded blocks, quantization step size, and/or whether the block is an intra-coded block or an inter-coded block. Else, if no table switch, the same table is used. The encoding in 805 includes locally modifying the quantization to decrease the number of events that need to be coded and to reduce the resulting coded bitstream length without significantly increasing the distortion, the locally modifying including one or more quantization modification methods, including at least one of the set consisting of Quantization Modification 2, Quantization Modification 3, Quantization Modification 4, and Quantization Modification 5. The quantization modification method takes into account and affects table switching in order to minimize the number of bits in the coded bitstream.

The method includes in 813 encoding the amplitude(s) of any non-zero-valued coefficients in the cluster that is/are not encoded by the joint event encoding, using a context adaptive amplitude coding method. The method includes in 815 encoding the signs. In 817 it is ascertained whether or not the end of first region has been reached. If not, the process returns to 805 to jointly encode the position of the next event, else, if the end of the first region has been reached, and in the case there is more than one region in the series, e.g., for hybrid variable length coding, the quantized coefficient(s) in the remaining region(s) is/are coded in 819.

Figure 9:
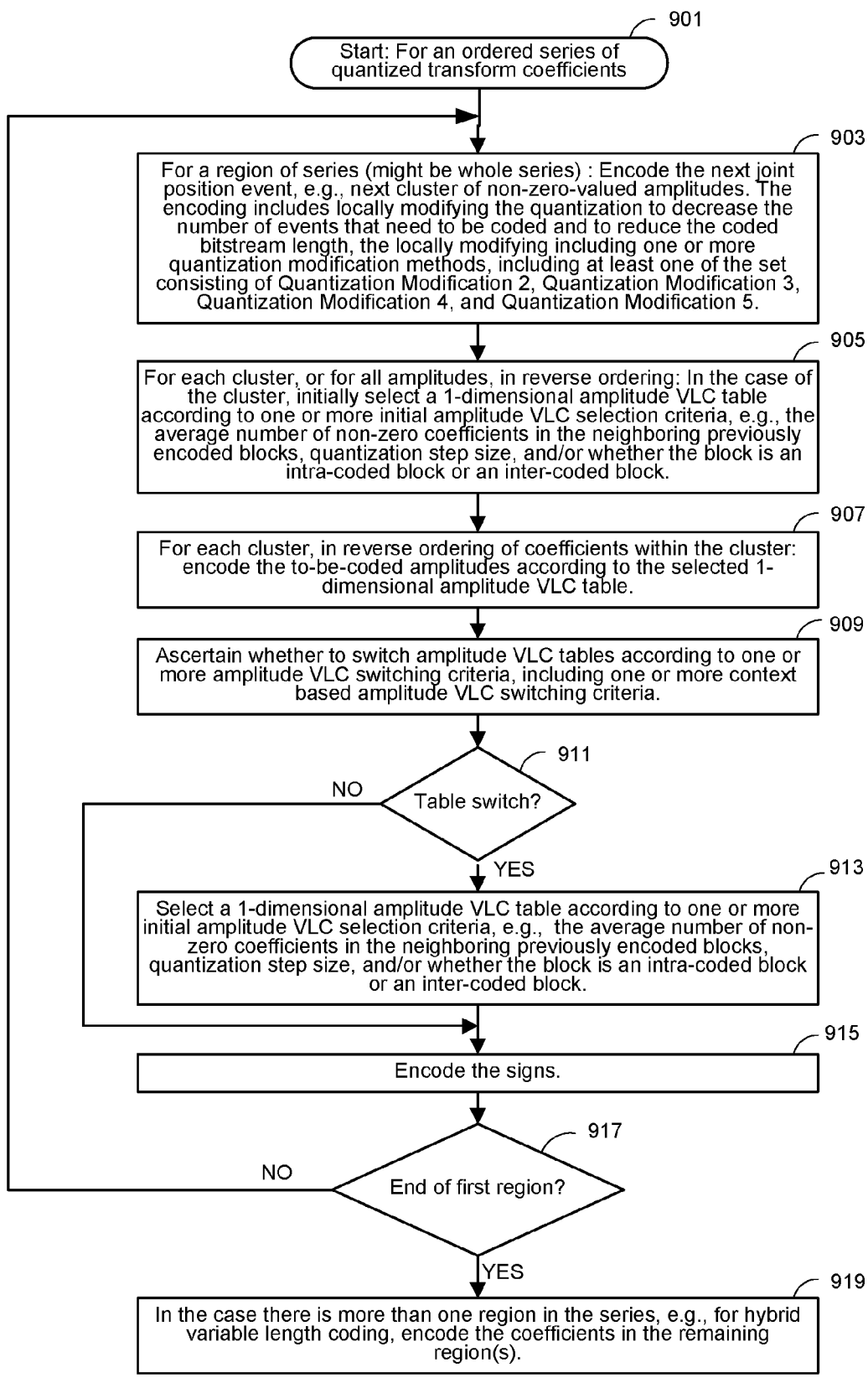
FIG. 9 shows a flowchart of another example embodiment of a method of encoding.

FIG. 9 shows a flowchart of another example embodiment of a method of encoding. Some of the reference numerals used in FIG. 9 might refer to steps that in other drawings have different reference numerals. The method starts in 901 and is for an ordered series of quantized transform coefficients from a block of image data. Steps 903 to 917 occur for a region of the series—this region might be the whole series. The method includes in 903 encoding the next joint position event in the first region, e.g., next cluster of non-zero-valued amplitudes. The encoding includes locally modifying the quantization to decrease the number of events that need to be coded and to reduce the resulting coded bitstream length without significantly increasing the distortion, the locally modifying including one or more quantization modification methods, including at least one of the set consisting of Quantization Modification 2, Quantization Modification 3, Quantization Modification 4, and Quantization Modification 5. Note that if Quantization Modification 1 is included, there are at least two quantization modification methods included.

The method continues in 905, for each cluster, or for all amplitudes, in reverse ordering, encoding the amplitudes: In the case of a cluster, the method includes in 905 initially selecting a 1-dimensional amplitude VLC table according to one or more initial amplitude VLC selection criteria, e.g., the average number of non-zero coefficients in the neighboring previously encoded blocks, the quantization step size, and/or whether the block is an intra-coded block or an inter-coded block. The method includes in 907, for each cluster, in reverse ordering of coefficients within the cluster: encoding the to-be-coded amplitudes according to the selected 1-dimensional amplitude VLC table. The method includes in 909 ascertaining whether to switch amplitude VLC tables according to one or more amplitude VLC switching criteria, including one or more context based amplitude VLC switching criteria. If there was table switch ascertained (911), in 913 a 1-dimensional amplitude VLC table is selected according to one or more initial amplitude VLC selection criteria, e.g., the average number of non-zero coefficients in the neighboring previously encoded blocks, the quantization step size, and/or whether the block is an intra-coded block or an inter-coded block. If there is no table switch ascertained, 913 is skipped. The method includes in 915 encoding the signs of the non-zero amplitude quantized coefficients. In 917 it is ascertained whether or not the end of first region has been reached. If not, the process returns to 903. Else, if the end of the first region has been reached, and in the case there is more than one region in the series, e.g., for hybrid variable length coding, the quantized coefficient(s) in the remaining region(s) is/are coded in 919.

Separating Quantization (Including Local Modification) and Encoding

Note that if Quantization Modification 3 and Quantization Modification 4 are both not included, the quantization modification is separable from the encoding. Hence, in some embodiments that do not include either Quantization Modification 3 or Quantization Modification 4, the method includes:

I) Quantizing the ordered series of transform coefficients, e.g., by a conventional fixed quantization method with a particular quantization parameter to generate an ordered sequence of intermediate quantized coefficients.

II) Examining the ordered sequence of intermediate quantized coefficients in a pre-defined order, and applying local quantization modification according to one or more of Quantization Modification 1, Quantization Modification 2 and Quantization Modification 5 to generate an ordered sequence of intermediate quantized coefficients.

III) Encode the ordered sequence of intermediate quantized coefficients according to a variable length coding method, such as one of the methods described in U.S. Ser. No. 12/336,364, U.S. Ser. No. 12/016,441, or U.S. Ser. No. 12/030,821.

Rate-Distortion Optimization

Alternate embodiments include a coding method, an apparatus, software embodied in a tangible computer-readable storage medium, and a tangible computer-readable storage medium that stored instructions that when executed cause a coding method to be executed. The coding method includes locally variable quantization using simplified rate-distortion optimization—a sub-optimal solution to rate-distortion optimization.

Consider an n×n block of $n_2$ ordered transform coefficients. Denote the unquantized transform coefficients of the n×n block as the set $T=(t_1, t_2, \ldots, t_n)$, denote the quantized coefficients by the set $Q=(q_1, q_2, \ldots, q_n)$, and denote the re-constructed (de-quantized) transform coefficients as the set $T'=(t_1', t_2', \ldots, t_n')$. Then the goal of the optimal rate-distortion quantization is to determine the quantization that minimizes a rate-distortion cost function (D+λR), that is, to find the set Q* that minimizes (D+λR):

$$Q^* = \operatorname*{argmin}_{Q}(D + \lambda R),$$

where R is the bit rate used by a coding method, e.g., an entropy coding method, or a hybrid VLC method to determine the quantization coefficient block Q from T, D is the distortion between the original transform coefficients T and the de-quantized transform coefficients T', and λ is a parameter that specifies the relative importance of the distortion D and the rate R.

This general rate-distortion optimization framework can be used to optimize the rate-distortion performance for any kinds of quantization schemes and entropy coding schemes. The quantization and entropy coding need be jointly treated, and the rate-distortion optimized quantization is different for different entropy coding schemes. The rate-distortion optimized quantization can be solved by exhaustive search. However, the inventors have found it not practical due to its relatively high computational complexity.

To reduce the computational complexity while retaining efficiency, the inventors have designed a simplified search method that generates a sub-optimal, yet useful solution to the rate-distortion optimization problem when applied to a VLC method, e.g., hybrid VLC, e.g., context adaptive hybrid VLC. The method includes carrying out locally variable quantization on only small-amplitude coefficients—those coefficients that would be quantized to have amplitudes 0, 1, or 2 by a standard regular quantization method such as the quantization method used in H.264/AVC. In the case of 3D position-amplitude event coding, such modified quantization affects both the 3D position-amplitude and 1D amplitude code event generation in the case of 3D hybrid VLC, and in the case of context adaptive hybrid VLC, also the code table switching as discussed above.

Figure 10:
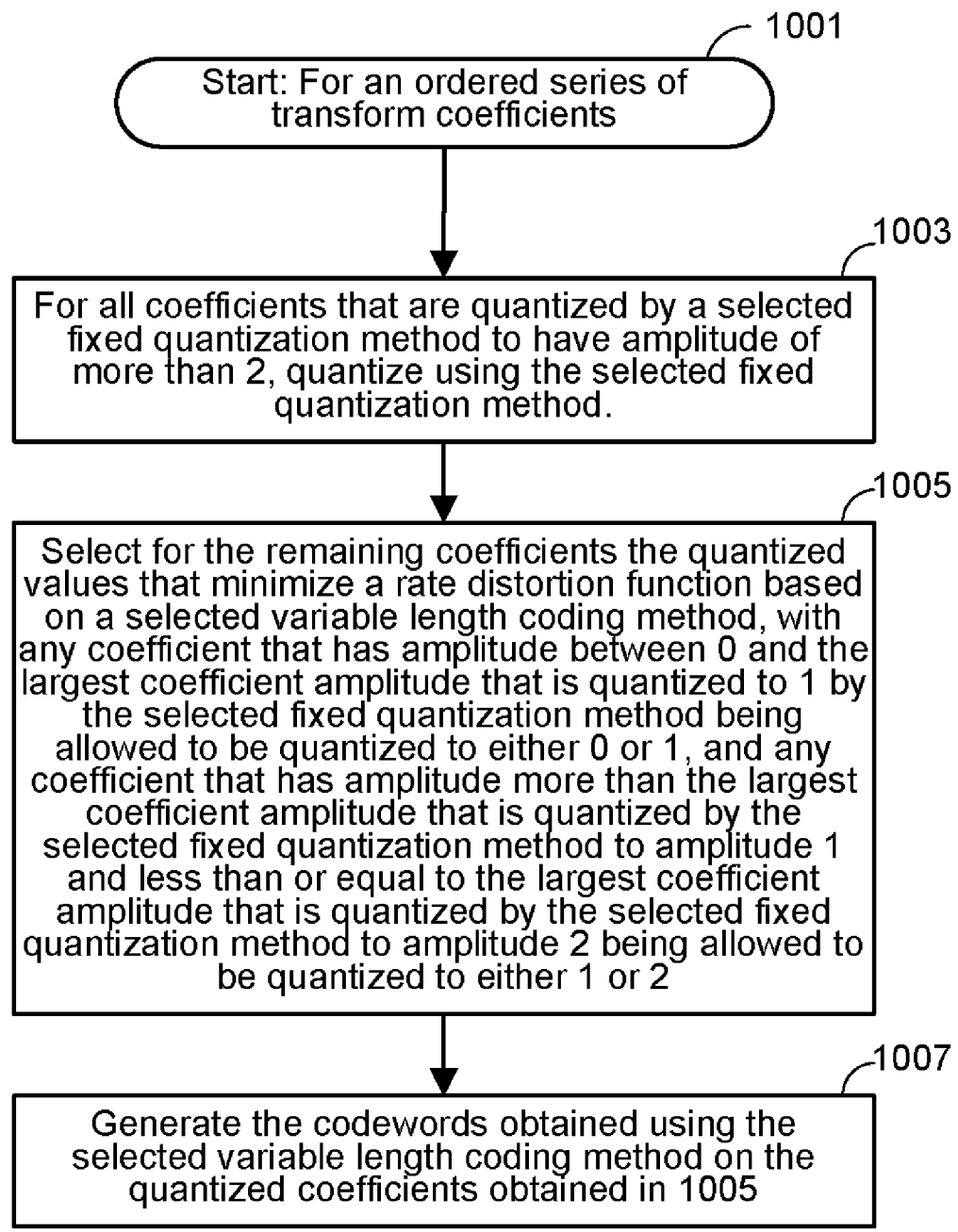
FIG. 10 shows a flow chart of an embodiment of a method of carrying out joint quantization and variable length coding, including rate distortion optimization carried out over a small range of quantized values.

FIG. 10 shows a flow chart of an embodiment of a method of carrying out joint quantization and variable length coding based on a pre-defined variable length coding method, e.g., a hybrid VLC method, e.g., context adaptive hybrid VLC. The method starts (1001) and is carried out for an ordered series of transform coefficients for an image block. For the first region, the method includes in 1003 using the quantized result of using a fixed quantization method, e.g., H.264/AVC quantization for all coefficients that are quantized by a fixed quantization method to have amplitude of more than 2. The method further includes in 1005 selecting for the remaining coefficients the quantized values that minimizes a rate distortion function, e.g., (D+λR) using the pre-defined variable length coding method, with any coefficient that has amplitude between 0 and the largest coefficient amplitude that is quantized to 1 by the fixed quantization method being allowed to be quantized to either 0 or 1, and any coefficient that has amplitude more than the largest coefficient amplitude that is quantized by the fixed quantization method to amplitude 1 and less than the largest coefficient amplitude that is quantized by the fixed quantization method to amplitude 2 being allowed to be quantized to either 1 or 2. In 1007 the method includes generating codewords using the pre-defined variable length coding method for the quantized coefficients obtained in 1005. Note in some embodiments, any coefficient that is equal to the largest coefficient amplitude that is quantized by the fixed quantization method to amplitude 2 is also allowed to be quantized to either 1 or 2.

Denote by $a_1$ the largest coefficient that is quantized to amplitude 1, and by $a_2$ the largest coefficient that is quantized to amplitude 2 by the fixed quantization method, e.g., by standard H.264/AVC quantization. Embodiments of the method include the following three steps:

Step 1: For any transform coefficient that is larger than the largest coefficient amplitude that is quantized to amplitude 2 by the fixed quantization method, i.e., for any $q_i \in (a_2, \infty)$, i=1, . . . , 64, quantize the coefficient using the fixed quantization method, e.g., standard H.264/AVC quantization.

Step 2: for any coefficient that has amplitude between 0 and the largest coefficient amplitude that is quantized to 1 by the fixed quantization method, that is, for $q_i \in (0, a_1]$, i=1, . . . , 64, allow the quantized coefficient to have either quantized amplitude 0 or quantized amplitude 1, and for any coefficient that has amplitude more than the largest coefficient amplitude that is quantized by the fixed quantization method to amplitude 1 and less than or equal to the largest coefficient amplitude that is quantized by the fixed quantization method to amplitude 2, i.e., for $q_i \in (a_1, a_2]$, i=1, . . . , 64, allow the quantized coefficient to have either quantized amplitude 1 or quantized amplitude 2. Thus, if there is a number denoted N of coefficients with amplitude in the range of $[0, a_2]$, then there are $2^N$ combinations of possible quantized amplitudes.

Step 3: Compute and compare the rate-distortion cost D+λR for all the $2^N$ combinations to find the best case, D+λR computed using a pre-defined VLC method, e.g., a hybrid VLC method such as context adaptive hybrid VLC. The best case generates the quantized coefficient set Q. The D+λR for such Q provides the resulting variable length codewords.

Decoding

While the above descriptions were mostly of coding methods, those in the art will understand that the present description also leads to decoding methods and apparatuses that decode a bitstream that was coded by any of the coding embodiments described herein. The decoding method includes accepting a bitstream including codewords encoded by the coding method described above, including recognizing codewords in the bitstream and decoding the codewords. The codewords are decoded using VLC tables. For context adaptive VLC methods, the VLC tables for decoding are selected according to one or more context-based selection criteria as used in the coding. Because any decoded item of information can be used by a coder in the decoding process, during decoding of a codeword, any context-based selection criterion is known or derivable from one or more previously decoded items of information. For example, any table switching uses information of previously decoded coefficients, e.g., of block(s) adjacent to the blocks being coded, and/or previously decoded coefficients within the block being decoded, which VLC table was used for a particular codeword is included in the decoding method according to the same criterion as would be used by an encoding method.

In the case the coding method is a hybrid method, such that the series includes a first region and one or more other regions, the coding method further includes encoding the coefficients in the remaining region(s). The decoding method further includes decoding those of the codewords that are of the remaining regions.

Apparatus Embodiments

Particular embodiments include an apparatus comprising: an encoder configured to encode the position and amplitudes of clusters of non-zero-valued coefficients in an ordered series of transform coefficients of a block of image data, the series having a most likely-to-occur amplitude, e.g., 0, and at least one other amplitude including a second-most likely-to-occur amplitude, e.g., 1. The apparatus includes a quantizer and a quantization modifier. For context adaptive coding, the encoder including a joint encoder configured to encode in a first region of the series, joint position and amplitude events that each are defined by a cluster of consecutive non-zero-valued coefficients, each event defined by three parameters: the number of zero-valued coefficients preceding the cluster, the number of non-zero-valued coefficients in the cluster, and a third parameter indicative of the number of trailing non-zero-valued coefficients that have amplitude 1 in the cluster, with the coding according to a 3-dimensional joint VLC table. In some embodiments, for a cluster length of 2, the third parameter indicates which of the two quantized coefficients has amplitude 1. In some embodiments, for a cluster length of one, the third parameter indicates value of the non-zero amplitude. The joint encoder includes the quantization modifier that is configured to locally modify the quantization generated by the quantizer to decrease the number of events that need to be coded and to reduce the coded bitstream length, the locally modifying including one or more quantization modification methods, including at least one of the set consisting of Quantization Modification 2, Quantization Modification 3, Quantization Modification 4, and Quantization Modification 5.

The apparatus further includes an amplitude encoder configured to encode the non-zero-valued coefficients that were not encoded by the joint encoding, e.g., encoding other than the amplitude 1 trailing coefficients. Such amplitudes include the next most likely-to-occur amplitude to amplitude 1, which is amplitude 2. In some embodiments, the coefficient amplitude encoder uses a 1-D VLC for each value indicative of the amplitude. One embodiment separately encodes the non-zero-valued coefficients other than that adjacent to the trailing amplitude 1 coefficients, then encodes a value, the (amplitude value minus 1) of the adjacent non-zero coefficient since that coefficient has amplitude greater than 1.

The apparatus further includes a sign encoder configured to encode the sign of the non-zero-valued coefficients in the clusters.

One embodiment of the encoder that encodes using a hybrid variable length coding method is configured to encode, in the case there are two or more regions defines for the ordered series, the coefficients of the remaining regions.

The encoder further includes a concatenator configured to concatenate the resulting codewords.

Figure 11:
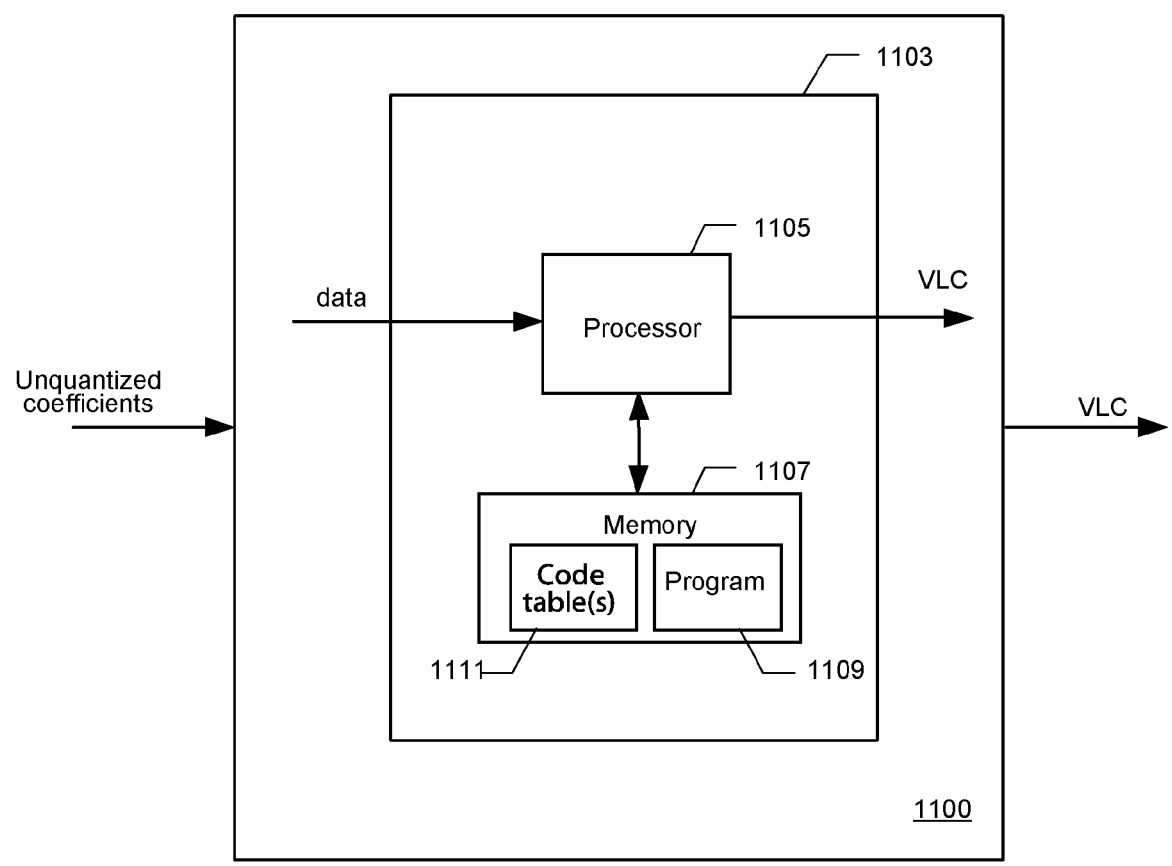
FIG. 11 shows an embodiment that includes an apparatus that is configured to implement a coding method as described herein.

FIG. 11 shows an embodiment that includes an apparatus 1100 that is configured to implement a coding method as described herein, e.g., as described in FIG. 3. Apparatus 1100 includes processing system 1103 that includes one or more processors 1105 and a memory 1107. The apparatus is configured to accept a series of unquantized transform coefficients, or in another embodiment, an ordered series of quantized transform coefficients, quantized by a fixed quantization method. A single processor is shown in FIG. 11 and those in the art will appreciate that this may represent several processors. Similarly, a single memory subsystem 1107 is shown, and those in the art will appreciate that the memory subsystem may include different elements such as RAM, ROM, and so forth. In addition, the memory subsystem is meant to include any non-volatile memory storage such as a magnetic or optical storage component. A computer program 1109 is included and is loaded into the memory 1107. Note that at any time, some of the programs may be in the different parts of the memory subsystem, as will be understood by those in the art. The program 1109 includes instructions to instruct the processor to implement a quantizer (in the case of unquantized inputs), and, in different versions, the respective different coding methods including the respective different position coding methods and respective different amplitude coding methods and any one of the quantization modification methods described herein for the first region and if a hybrid coding method and for the remaining regions. In the embodiment shown, the method uses one or more coding tables 1111 in the memory subsystem 1107.

Figure 12:
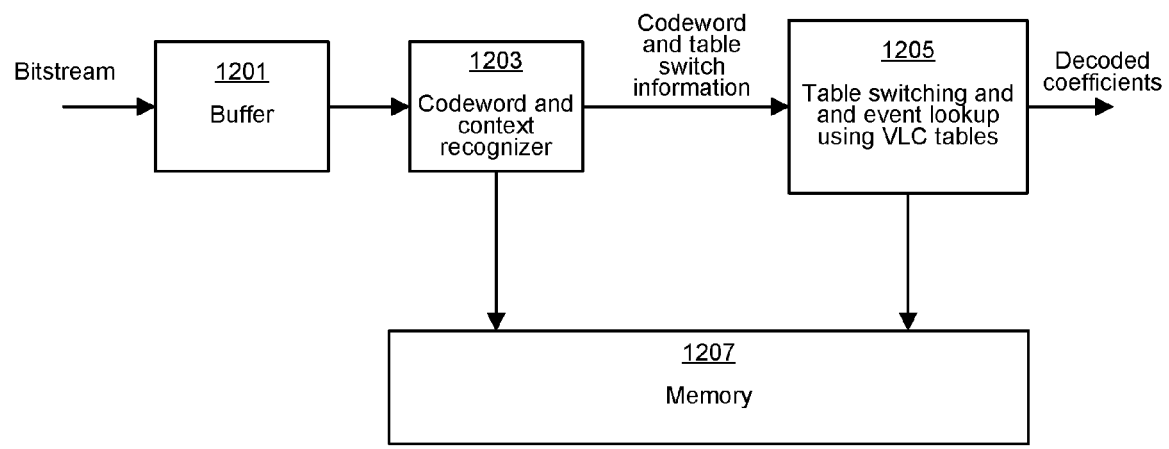
FIG. 12 shows one embodiment of a decoder.

FIG. 12 shows one embodiment of a decoder configured to decode a bitstream encoded by a pre-defined coding method. The apparatus includes an input buffer 1201 that is configured to accept a bitstream encoded by a compression method that includes any of the coding method embodiments described herein.

The output of the buffer acts as input to a codeword recognizer 1203. Element 1203 in the case of context based coding is a codeword recognizer and context determiner 1203 that accepts the bits of the input bitstream and that is configured to determine which of the coding tables the codeword is from, e.g., based on context. A decoder 1205 is coupled to the codeword recognizer and context determiner 1203 and is configured to determine the data for the codeword recognized by the codeword recognizer, including, for any of the position coding methods described herein, a codeword recognizer that can ascertain the position of the non-zero or zero valued coefficients, depending on the position coding used. The codeword recognizer also recognizes other codewords that encode other parameters encoded by the coding method, including the non-zero values, an indication of the number of trailing coefficients, and so forth. The codeword recognizer and context determiner 1203 also provides information to enable a decoder 1205 to determine which code table, used as a decoding table to use. In some embodiments, the decoder 1205 includes a lookup device that looks up the appropriate decoding table stored in a memory 1207. That table provides the event for at least some of the codewords of the set of codewords. Other codewords may include an "escape" code, so that decoding is by other than a table lookup method.

While in the embodiment shown in FIG. 12, the memory is shown separate from the lookup device (decoder) 1205, those in the art will understand that in other embodiments, the lookup device 1205 includes memory for the tables, and such other embodiments are included herein.

Figure 13:
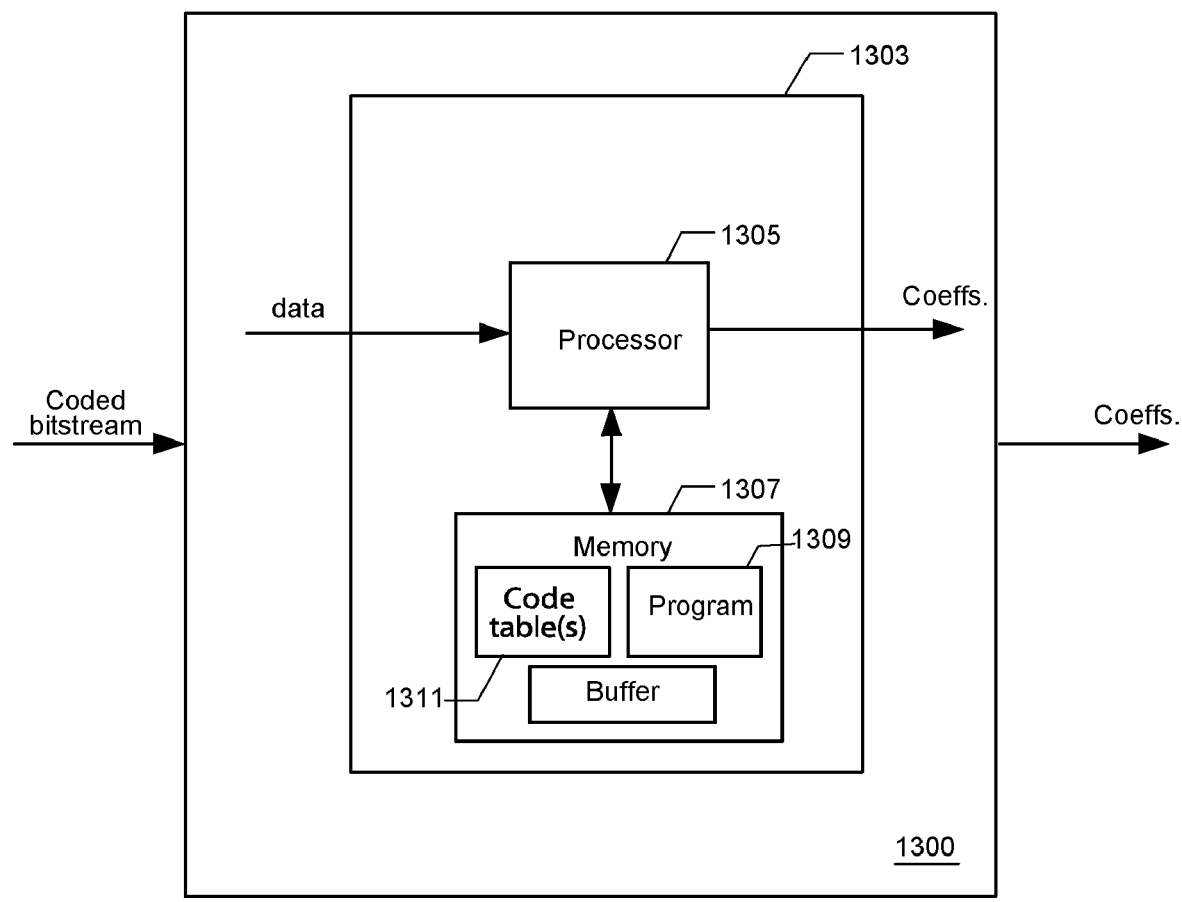
FIG. 13 shows an embodiment that includes an apparatus that is configured to implement a decoding method as described herein.

FIG. 13 shows another embodiment that includes an apparatus 1300 configured to implement a decoder of a variable length coding method described herein. Decoding apparatus 1300 includes a processing system 1303 that includes one or more processors 1305 and a memory 1307. A single processor is shown in FIG. 13 and those in the art will appreciate that this may represent several processors. Similarly, a single memory subsystem 1307 is shown, and those in the art will appreciate that the memory subsystem may include different elements such as RAM, ROM, and so forth. In addition, the memory subsystem is meant to include any non-volatile memory storage such as a magnetic or optical storage component. A computer program 1309 is included and is loaded into the memory 1307. Note that at any time, some of the programs may be in the different parts of the memory subsystem, as will be understood by those in the art. The program 1309 includes instructions to instruct the processor to implement, in different versions, the recognizing and decoding of codewords. In the embodiment shown, the decoding method uses one or more coding tables 1311 in the memory subsystem 1307. Part of the memory subsystem may also serve as a buffer for incoming bitstream that includes codewords to be decoded.

Other Embodiments

Other embodiments include logic encoded in one or more tangible media for execution and when executed operable to carry out any of the coding methods described herein. How to implement such logic would be clear to one in the art from the description herein.

Other embodiments include logic encoded in one or more tangible media for execution and when executed operable to carry out any of the decoding methods described herein. How to implement such logic would be clear to one in the art from the description herein.

Other embodiments include software encoded in one or more computer-readable media and when executed operable to carry out any of the coding methods described herein. How to implement such software would be clear to one in the art from the description herein.

Other embodiments include software encoded in one or more computer-readable media and when executed operable to carry out any of the decoding methods described herein. How to implement such software would be clear to one in the art from the description herein.

Other embodiments include a computer-readable medium having a set of instructions encoded thereon that when executed by one or more processors of a processing system cause carrying out any of the coding methods described herein.

Other embodiments include a computer-readable medium having a set of instructions coded thereon that when executed by one or more processors of a processing system cause carrying out any of the decoding methods described herein.

The term "series" as used herein for the series of quantized coefficients is sometimes referred to as a "block" of coefficients, and also as a "series" of coefficients. Sometimes the term "sequence" of coefficients is used. Those in the art will understand that such terms may be interchangeably used and the meaning would be clear to those in the art from the context.

Furthermore, the term coefficients as used herein typically refer to quantized transform coefficients.

Also, in the description, it is assumed that the series includes both the DC coefficient and the AC coefficients of the transform of the block. How to modify the methods described herein to include only the AC coefficients would be clear to those in the art.

Furthermore, in the description of example embodiments it was assumed that the quantization of coefficients is such that zero is the most likely-to-occur amplitude, 1 is the second-most likely-to-occur amplitude, and 2 is the third-most likely-to-occur amplitude. Of course it is possible to quantize in a manner so that other values or events are used for the most likely-to-occur quantized value or values, and different other values or events are used for the next most likely-to-occur quantized value or values. Those in the art will understand how to modify the particulars of the techniques and apparatuses described herein to accommodate such variations, and such variations are certainly meant to be within the scope of the present invention.

Furthermore, the invention is not limited to any one type of architecture or type of transform encoding. The transform used in some embodiments is the 8×8 transform defined in the H.264/MEG-4 AVC video coding standard/draft standard for the High Profile. Other embodiments use the transform for the Chinese AVS standard. Other embodiments use a discrete cosine transform (DCT). Other transforms also are possible. Also the bock size described herein is 8 by 8, and other block sizes also may be used in alternate embodiments.

The invention does not depend on any particular type of inter-frame coding if used, or of motion compensation if used for inter-frame coding, or any intra-estimation if used for estimating the pixels of a block using information from neighboring blocks.

Note that variable length coding is sometimes referred to as entropy coding or statistical coding.

Note that the terms coding and encoding are used interchangeably herein.

In some of the embodiments described above, no sign data was included. Most transforms produce positive and negative coefficients, and the forming of the codeword includes an indication of the sign of any non-zero-valued coefficients. In one version, the sign information for any runs of non-zero amplitudes in any region is added together with the information of each amplitude. In an alternate embodiment, the sign information for any runs of non-zero amplitudes in any region may be included in a different manner, e.g., as a code for the series of signs. Other alternate embodiments are also possible for encoding the sign.

Note that in some examples for amplitude encoding, a different number of possible non-zero values can be assumed for the coefficients. The invention however is not restricted to any number of possible quantization values.

Note also that the term amplitude is irrespective of sign. Therefore, for example, coefficient of values +1 and −1 both have amplitude 1.

While one embodiment described herein includes a memory that stores coding tables, other embodiments store the coding information in the form of a data structure other than a table, e.g., a structure that includes a tree. Other data structures may also be used. Similarly, while one embodiment described herein includes a memory that stores a decoding table, other embodiments store the decoding information in the form of a data structure other than a table for the decoding.

Note also that the present invention does not depend on the particular type of variable length coding used for any of the coding methods, e.g., the coding tables, and can work, for example, with Huffman coding and with arithmetic coding methods. Furthermore, while embodiments have been described that use fixed encoding for the events based on assumed or a priori likelihoods of occurrence of the events (also called the events), i.e., the likelihoods of occurrence of the events do not change, other embodiments use adaptive encoding, i.e., the encoding is changeable according to statistical data such as histograms collected from the actual coefficients.

Unless specifically stated otherwise, as apparent from the following discussions, it is appreciated that throughout the specification discussions using terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., steps, is implied, unless specifically stated.

The methodologies described herein are, in some embodiments, performable by one or more processors that accept computer-readable (also called machine-readable) logic encoded on one or more computer-readable storage media containing a set of instructions that when executed by one or more of the processors carry out at least one of the methods described herein. Any processor capable of executing a set of instructions (sequential or otherwise) that specify actions to be taken are included. Thus, one example is a typical processing system that includes one or more processors. Each processor may include one or more of a CPU, a graphics processing unit, and a programmable DSP unit. The processing system further may include a memory subsystem including main RAM and/or a static RAM, and/or ROM. A bus subsystem may be included for communicating between the components. The processing system further may be a distributed processing system with processors coupled by a network. If the processing system requires a display, such a display may be included, e.g., a liquid crystal display (LCD) or a cathode ray tube (CRT) display. If manual data entry is required, the processing system also includes an input device such as one or more of an alphanumeric input unit such as a keyboard, a pointing control device such as a mouse, and so forth. The term memory unit as used herein, if clear from the context and unless explicitly stated otherwise, also encompasses a storage system such as a disk drive unit. The processing system in some configurations may include a sound output device, and a network interface device. The memory subsystem thus includes a computer-readable storage medium that is encoded with logic (e.g., software) including a set of instructions to cause performing, when executed by one or more processors, one of more of the methods described herein. The software may reside in the hard disk, or may also reside, completely or at least partially, within the RAM and/or within the processor during execution thereof by the computer system. Thus, the memory and the storage locations with the processor are examples of computer-readable storage medium on which is encoded logic, e.g., in the form of instructions.

Furthermore, a computer-readable storage medium may form, or be included in a computer program product.

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The one or more processors may form a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the logic including instructions, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer-readable medium having a set of instructions, e.g., a computer program encoded thereon that are for execution on one or more processors, e.g., one or more processors that are part of coder, or a decoder. Thus, as will be appreciated by those skilled in the art, embodiments of the present invention may be embodied as a method, an apparatus such as a special purpose apparatus, an apparatus such as a data processing system, or a computer-readable medium, e.g., a computer program product. The computer-readable storage medium encodes logic including a set of instructions that when executed on one or more processors cause implementing a method. Accordingly, aspects of the present invention may take the form of a method, an entirely hardware embodiment, an entirely software embodiment or an embodiment combining software and hardware aspects. Furthermore, the present invention may take the form of a computer-readable medium (e.g., a computer program product that is or is on a computer-readable storage medium) having program code encoded on the medium.

It will be understood that the steps of methods discussed are performed in some embodiments by an appropriate processor (or processors) of a processing (i.e., computer) system executing instructions stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in some embodiments" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Description of Example Embodiments are hereby expressly incorporated into this Description of Example Embodiments, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given series, either temporally, spatially, in ranking, or in any other manner.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of operating a processing apparatus, the method comprising:

for a first region of an ordered series of transform coefficients of a block of image data, the ordering from low to high spatial frequency according to a transform, the first region possibly the whole region, and for a fixed quantization method that quantizes coefficients to quantized values that have amplitudes including a most likely-to-occur amplitude, a second-most likely-to-occur amplitude and at least one other amplitude, including a third-most likely-to-occur amplitude:

quantizing and encoding the first region and any other regions of the ordered series to form a coded bitstream using the processing apparatus; and outputting or storing the coded bitstream;

wherein the quantizing and encoding of the first region uses one or more variable length code (VLC) mappings, and wherein the quantizing of the first region includes quantizing to have the second-most likely-to-occur amplitude at least one coefficient that would be quantized by the fixed quantization method to have the most likely-to-occur amplitude, quantizing to have the most likely-to-occur amplitude at least one coefficient that would be quantized by the fixed quantization method to have the second-most likely-to-occur amplitude, and using the fixed quantization method to quantize any coefficient that is quantized by the fixed quantization method to have other than the most likely-to-occur amplitude, other than the second-most likely-to-occur amplitude, or other than the third-most likely-to-occur amplitude.

2. A method as recited in claim 1, wherein 0 is the most likely-to-occur amplitude, 1 is the second-most likely-to-occur amplitude, and 2 is the third-most likely-to-occur amplitude, and wherein the quantizing and encoding of the first region includes, for a pre-defined first region VLC method, selecting as quantization for the coefficients that are quantized by the fixed quantization method to have amplitude 0, 1, or 2, the quantized amplitude values that minimize a rate distortion function using the pre-defined VLC method, with any coefficient that has amplitude between 0 and the largest coefficient amplitude that is quantized to 1 by the fixed quantization method being allowed to be quantized to either 0 or 1, and any coefficient that has amplitude more than the largest coefficient amplitude that is quantized by the fixed quantization method to amplitude 1 and less than the largest coefficient amplitude that is quantized by the fixed quantization method to amplitude 2 being allowed to be quantized to either 1 or 2.

3. A method of operating a second apparatus to decode a coded bitstream, the coded bitstream including a set of concatenated codewords, the method comprising:

recognizing codewords in the bitstream, the codewords formed by a coding method of coding an ordered series of transform coefficients of a block of image data using one or more of a plurality of VLC mappings; and decoding the recognized codewords using one or more of the plurality of VLC mappings, wherein the coded bitstream is formed by a method as recited in claim 2.

4. A method as recited in claim 1, wherein the series is an ordered sequence of quantized transform coefficients quantized by the fixed quantization method, and wherein the method comprises, for the first region which could be the whole series:

encoding the position of events in the first region using one or more position VLC mappings, each event whose position is encoded including either exactly one quantized coefficient having other than the most likely-to-occur amplitude or a cluster of quantized coefficients each having other than the most likely-to-occur amplitude; and encoding any amplitude value other than the most likely-to-occur amplitude that is still to be encoded, the encoding according to one or more amplitude VLC mappings, wherein the encoding of the position of events includes modifying the quantization of quantized coefficients from quantization of the fixed quantization method according to one or more quantization modification methods of the set consisting of a first quantization modification method, a second quantization modification method, a third quantization modification method, a fourth quantization modification method, and a fifth quantization modification method, the first quantization modification method including replacing an isolated quantized coefficient having the second-most likely-to-occur amplitude with a quantized coefficient having the most likely-to-occur amplitude, the second quantization modification method including replacing an isolated quantized coefficient having the most likely-to-occur amplitude with a quantized coefficient having the second-most likely-to-occur amplitude, the third quantization modification method including replacing a pair of quantized coefficients starting with first quantized coefficient having the most likely-to-occur amplitude followed by a second quantized coefficient having the second-most likely-to-occur amplitude, the pair preceded by a sequence of one or more quantized coefficients having other than the most likely-to-occur amplitude and followed by a sequence of one or more quantized coefficients having the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, the fourth quantization modification method including replacing a pair of coefficients with the first quantized coefficient having the second-most likely-to-occur amplitude followed by a second quantized coefficient having the most likely-to-occur amplitude, the pair preceded by a sequence of one or more quantized coefficients having the most likely-to-occur amplitude and followed by a sequence of one or more quantized coefficients having other than the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, and the fifth quantization modification method including replacing, in a position event, a quantized coefficient having the third-most likely-to-occur amplitude followed by a trailing sequence of one or more coefficients having the second-most likely-to-occur amplitude in the position event, no other coefficients having other that the most likely-to-occur amplitude following the trailing sequence in the position event, the modifying the quantization including at least the second quantization modification method, the third quantization modification method, the fourth quantization modification method, or the fifth quantization modification method.

5. A method as recited in claim 4, wherein an isolated quantized coefficient having the second-most likely-to-occur amplitude is a quantized coefficient having the second-most likely-to-occur amplitude preceded and followed by a sequence of one or more quantized coefficients having the most likely-to-occur amplitude with a quantized coefficient having the most likely-to-occur amplitude, except in the case that the quantized coefficient having the second-most likely-to-occur amplitude is part of a pair of quantized coefficients starting with first quantized coefficient having the most likely-to-occur amplitude followed by a second quantized coefficient having the second-most likely-to-occur amplitude to which the third quantization modification method is applied, and wherein an isolated quantized coefficient having the most likely-to-occur amplitude is a quantized coefficient having the most likely-to-occur amplitude preceded and followed by a sequence of one or more quantized coefficients having other than the most likely-to-occur amplitude with a quantized coefficient having the second-most likely-to-occur amplitude, except in the case that the quantized coefficient having the most likely-to-occur amplitude is part of a pair of quantized coefficients starting with first quantized coefficient having the most likely-to-occur amplitude followed by a second quantized coefficient having the second-most likely-to-occur amplitude to which the fourth quantization modification method is applied.

6. A method as recited in claim 4, wherein the quantization modification for the quantized coefficients of the first region is carried out prior to any encoding of any coefficients in the first region, the quantization modification forming a first region of an ordered sequence of intermediate quantized coefficients, and wherein the coding of the first region is carried on the first region of the ordered sequence of intermediate quantized coefficients.

7. A method as recited in claim 4, wherein the position coding of events includes jointly encoding joint position and amplitude events that are each defined by the next cluster of one or more consecutive coefficients each having any amplitude other than the most likely-to-occur amplitude, each joint position and amplitude event defined by three parameters: the number, possibly zero, of coefficients having the most likely-to-occur amplitude preceding the cluster, the number of coefficients in the cluster having other than the most likely-to-occur amplitude, and a third parameter related to amplitudes in the cluster having other than the most likely-to-occur amplitude, the coding for each cluster that is being position coded being according to at least one three-dimensional joint VLC mapping.

8. A method as recited in claim 7, wherein for at least one cluster length, the third parameter includes an indication of the number of consecutive trailing coefficients in the cluster that each have the second-most likely-to-occur amplitude.

9. A method as recited in claim 8, wherein one or both:
A) for at least one cluster length, the third parameter includes an indication of which of the coefficients in the cluster have the second-most likely-to-occur amplitude; and
B) for a cluster length of one, the third parameter includes an indication of the amplitude of the coefficient in the cluster that has other than the most likely-to-occur amplitude.

10. A method as recited in claim 4,
wherein encoding the position of events in the first region uses a plurality of first-region VLC mappings, the encoding the position including initially selecting an initial position VLC mapping, and thereafter switching between position VLC mappings according to one or more position VLC selection criteria, including at least one context-based position VLC selection criterion; and
wherein encoding any amplitude that is still to be encoded is according to one of a plurality of amplitude VLC mappings, and includes initially selecting an amplitude VLC mapping, and switching between the plurality of amplitude VLC mappings according to one or more amplitude VLC selection criteria, including at least one context-based amplitude VLC selection criterion,
wherein by a context-based selection criterion is meant a criterion that during encoding is known or derivable from one or more previously encoded items of information.

11. A method as recited in claim 4,
wherein the position coding of events includes jointly encoding joint position and amplitude events, the next joint position and amplitude event being defined by the next cluster of one or more consecutive coefficients each having any other than the most likely-to-occur amplitude, each joint position and amplitude event defined by three parameters: the number, possibly zero, of coefficients having the most likely-to-occur amplitude preceding the cluster, the number of coefficients in the cluster having other than the most likely-to-occur amplitude, and a third parameter related to amplitudes in the cluster having other than the most likely-to-occur amplitude,
wherein the coding for the first cluster that is being position coded is according to an initial three-dimensional joint VLC mapping selected from a set of three-dimensional joint VLC mappings according to one or more initial position VLC selection criteria, including at least one context-based initial position VLC selection criterion, and the position coding of each other cluster includes determining whether to switch to another a three-dimensional joint VLC mapping and in the case there is switching, coding according to a three-dimensional joint VLC mapping selected from the set of three-dimensional joint VLC mappings according to one or more position VLC selection criteria, including at least one context-based position VLC selection criterion,
wherein the encoding of any amplitude values that are still to be encoded includes, for each cluster wherein there is at least one amplitude still to be encoded, encoding, in reverse ordering to the ordering of the series, the next to-be-encoded amplitude according to one of a plurality of amplitude VLC mappings, the amplitude VLC mapping initially selected according to one or more initial amplitude VLC selection criteria, including at least one context-based initial amplitude VLC selection criterion, and thereafter selected after determining whether to switch to another of the plurality of amplitude VLC mappings according to one or more amplitude VLC selection criteria, including at least one context-based amplitude VLC selection criterion.

12. A method of operating a second apparatus to decode a coded bitstream, the coded bitstream including a set of concatenated codewords, the method comprising:
recognizing codewords in the bitstream, the codewords formed by a coding method of coding an ordered series of transform coefficients of a block of image data using one or more of a plurality of VLC mappings; and
decoding the recognized codewords using one or more of the plurality of VLC mappings,
wherein the coded bitstream is formed by a method as recited in claim 4.

13. A non-transitory computer-readable storage medium having instructions stored thereon that when executed by one or more processors of a processing apparatus carry out a method comprising:
for a first region of an ordered series of transform coefficients of a block of image data, the ordering from low to high spatial frequency according to a transform, the first region possibly the whole region, and for a fixed quantization method that quantizes coefficients to quantized values that have amplitudes including a most likely-to-occur amplitude, a second-most likely-to-occur amplitude and at least one other amplitude, including a third-most likely-to-occur amplitude:
quantizing and encoding the first region and any other regions of the ordered series to form a coded bitstream;
wherein the quantizing and encoding of the first region uses one or more variable length code (VLC) mappings, and wherein the quantizing of the first region includes quantizing to have the second-most likely-to-occur amplitude at least one coefficient that would be quantized by the fixed quantization method to have the most likely-to-occur amplitude, quantizing to have the most likely-to-occur amplitude at least one coefficient that would be quantized by the fixed quantization method to have the second-most likely-to-occur amplitude, and using the fixed quantization method to quantize any coefficient that is quantized by the fixed quantization method to have other than the most likely-to-occur amplitude, other than the second-most likely-to-occur amplitude, or other than the third-most likely-to-occur amplitude.

14. A non-transitory computer-readable storage medium as recited in claim 13,
wherein 0 is the most likely-to-occur amplitude, 1 is the second-most likely-to-occur amplitude, and 2 is the third-most likely-to-occur amplitude, and
wherein the quantizing and encoding of the first region includes, for a pre-defined first region VLC method, selecting as quantization for the coefficients that are quantized by the fixed quantization method to have amplitude 0, 1, or 2, the quantized amplitude values that minimize a rate distortion function using the pre-defined VLC method, with any coefficient that has amplitude between 0 and the largest coefficient amplitude that is quantized to 1 by the fixed quantization method being allowed to be quantized to either 0 or 1, and any coefficient that has amplitude more than the largest coefficient amplitude that is quantized by the fixed quantization method to amplitude 1 and less than the largest coefficient amplitude that is quantized by the fixed quantization method to amplitude 2 being allowed to be quantized to either 1 or 2.

15. A non-transitory computer-readable storage medium as recited in claim 13, wherein the series is an ordered sequence of quantized transform coefficients quantized by the fixed quantization method, and wherein the method comprises, for the first region which could be the whole series:
encoding the position of events in the first region using one or more position VLC mappings, each event whose position is encoded including either exactly one quantized coefficient having other than the most likely-to-occur amplitude or a cluster of quantized coefficients each having other than the most likely-to-occur amplitude; and
encoding any amplitude value other than the most likely-to-occur amplitude that is still to be encoded, the encoding according to one or more amplitude VLC mappings,
wherein the encoding of the position of events includes modifying the quantization of quantized coefficients from quantization of the fixed quantization method according to one or more quantization modification methods of the set consisting of a first quantization modification method, a second quantization modification method, a third quantization modification method, a fourth quantization modification method, and a fifth quantization modification method,
the first quantization modification method including replacing an isolated quantized coefficient having the second-most likely-to-occur amplitude with a quantized coefficient having the most likely-to-occur amplitude,
the second quantization modification method including replacing an isolated quantized coefficient having the most likely-to-occur amplitude with a quantized coefficient having the second-most likely-to-occur amplitude,
the third quantization modification method including replacing a pair of quantized coefficients starting with first quantized coefficient having the most likely-to-occur amplitude followed by a second quantized coefficient having the second-most likely-to-occur amplitude, the pair preceded by a sequence of one or more quantized coefficients having other than the most likely-to-occur amplitude and followed by a sequence of one or more quantized coefficients having the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter,
the fourth quantization modification method including replacing a pair of coefficients with the first quantized coefficient having the second-most likely-to-occur amplitude followed by a second quantized coefficient having the most likely-to-occur amplitude, the pair preceded by a sequence of one or more quantized coefficients having the most likely-to-occur amplitude and followed by a sequence of one or more quantized coefficients having other than the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, and
the fifth quantization modification method including replacing, in a position event, a quantized coefficient having the third-most likely-to-occur amplitude followed by a trailing sequence of one or more coefficients having the second-most likely-to-occur amplitude in the position event, no other coefficients having other that the most likely-to-occur amplitude following the trailing sequence in the position event,
the modifying the quantization including at least the second quantization modification method, the third quantization modification method, the fourth quantization modification method, or the fifth quantization modification method.

16. A non-transitory computer-readable storage medium as recited in claim 15,
wherein the quantization modification for the quantized coefficients of the first region is carried out prior to any encoding of any coefficients in the first region, the quantization modification forming a first region of an ordered sequence of intermediate quantized coefficients, and wherein the coding of the first region is carried on the first region of the ordered sequence of intermediate quantized coefficients.

17. A non-transitory computer-readable storage medium as recited in claim 15, wherein the position coding of events includes jointly encoding joint position and amplitude events, the next joint position and amplitude event being defined by the next cluster of one or more consecutive coefficients each having any other than the most likely-to-occur amplitude, each joint position and amplitude event defined by three parameters: the number, possibly zero, of coefficients having the most likely-to-occur amplitude preceding the cluster, the number of coefficients in the cluster having other than the most likely-to-occur amplitude, and a third parameter related to amplitudes in the cluster having other than the most likely-to-occur amplitude, the coding for the first cluster that is being position coded being according to a three-dimensional joint VLC mapping selected according to one or more initial position VLC selection criteria, including at least one context-based initial position VLC selection criterion, and after the first cluster is position coded, according to one or more position VLC selection criteria, including at least one context-based position VLC selection criterion.

18. A non-transitory computer-readable storage medium as recited in claim 17, wherein for at least one cluster length, the third parameter includes an indication of the number of consecutive trailing coefficients in the cluster that each have the second-most likely-to-occur amplitude.

19. A non-transitory computer-readable storage medium as recited in claim 15, wherein encoding the position of events in the first region uses a plurality of VLC mappings, the encoding the position including initially selecting an initial position VLC mapping, and thereafter switching between position VLC mappings according to one or more position VLC selection criteria, including at least one context-based position VLC selection criterion; and wherein encoding any amplitude that is still to be encoded is according to one of a plurality of amplitude VLC mappings, and includes initially selecting an amplitude VLC mapping, and switching between the plurality of amplitude VLC mappings according to one or more amplitude VLC selection criteria, including at least one context-based amplitude VLC selection criterion, wherein by a context-based selection criterion is meant a criterion that during encoding is known or derivable from one or more previously encoded items of information.

20. A non-transitory computer-readable storage medium as recited in claim 15, wherein the position coding of events includes jointly encoding joint position and amplitude events, the next joint position and amplitude event being defined by the next cluster of one or more consecutive coefficients each having any other than the most likely-to-occur amplitude, each joint position and amplitude event defined by three parameters: the number, possibly zero, of coefficients having the most likely-to-occur amplitude preceding the cluster, the number of coefficients in the cluster having other than the most likely-to-occur amplitude, and a third parameter related to amplitudes in the cluster having other than the most likely-to-occur amplitude, wherein the coding for the first cluster that is being position coded is according to an initial three-dimensional joint VLC mapping selected from a set of three-dimensional joint VLC mappings according to one or more initial position VLC selection criteria, including at least one context-based initial position VLC selection criterion, and the position coding of each other cluster includes determining whether to switch to another a three-dimensional joint VLC mapping and in the case there is switching, coding according to a three-dimensional joint VLC mapping selected from the set of three-dimensional joint VLC mappings according to one or more position VLC selection criteria, including at least one context-based position VLC selection criterion, wherein the encoding of any amplitude values that are still to be encoded includes, for each cluster wherein there is at least one amplitude still to be encoded, encoding, in reverse ordering to the ordering of the series, the next to-be-encoded amplitude according to one of a plurality of amplitude VLC mappings, the amplitude VLC mapping initially selected according to one or more initial amplitude VLC selection criteria, including at least one context-based initial amplitude VLC selection criterion, and thereafter selected after determining whether to switch to another of the plurality of amplitude VLC mappings according to one or more amplitude VLC selection criteria, including at least one context-based amplitude VLC selection criterion.

21. An apparatus comprising:

a quantizer and encoder configured to quantize and encode an ordered series of transform coefficients of a block of image data using a plurality of variable length code (VLC) mappings to form a coded bitstream, the ordering from low to high spatial frequency according to a transform, the quantizer and encoder comprising:

a first region quantizer and encoder configured to quantize and encode the coefficients of a first region of the ordered series using one or more variable length code mappings, the first region being possibly the whole ordered series, wherein the quantizing of the first region by the first region quantizer and encoder includes using a fixed quantization method configured to quantize coefficient values of blocks of image data using a fixed quantization method to quantized values that have amplitudes including a most likely-to-occur amplitude, a second-most likely-to-occur amplitude and at least one other amplitude, including a third-most likely-to-occur amplitude:

quantizing to have the second-most likely-to-occur amplitude at least one coefficient that would be quantized by the fixed quantization method to have the most-likely-to occur amplitude, quantizing to have the most-likely-to occur amplitude at least one coefficient that would be quantized by the fixed quantization method to have the second-most-likely-to occur amplitude, and using the fixed quantization method to quantize any coefficient that is quantized by the fixed quantization method to have other than the most likely-to-occur amplitude, other than the second-most likely-to-occur amplitude, or other than the third-most likely-to-occur amplitude.

22. An apparatus as recited in claim 21, wherein 0 is the most likely-to-occur amplitude, 1 is the second-most likely-to-occur amplitude, and 2 is the third-most likely-to-occur amplitude, and wherein the quantizing and encoding of the first region by the first region quantizer and encoder includes, for a selected first region VLC method, selecting as quantization for the coefficients that are quantized by the fixed quantization method to have amplitude 0, 1, or 2, the quantized amplitude values that minimize a rate distortion function using the first region VLC method, with any coefficient that has amplitude between 0 and the largest coefficient amplitude that is quantized to 1 by the fixed quantization method being allowed to be quantized to either 0 or 1, and any coefficient that has amplitude more than the largest coefficient amplitude that is quantized by the fixed quantization method to amplitude 1 and less than the largest coefficient amplitude that is quantized by the fixed quantization method to amplitude 2 being allowed to be quantized to either 1 or 2.

23. An apparatus as recited in claim 21, wherein the series is an ordered sequence of quantized transform coefficients quantized by the fixed quantization method, and wherein the first region quantizer and encoder is configured, for the first region which could be the whole series to:

encode the position of events in the first region using one or more position VLC mappings, each event whose position is encoded including either exactly one quantized coefficient having other than the most likely-to-occur amplitude or a cluster of quantized coefficients each having other than the most likely-to-occur amplitude; and encode any amplitude value other than the most likely-to-occur amplitude that is still to be encoded, the encoding according to one or more amplitude VLC mappings, further wherein the encoding of the position of events includes modifying the quantization of quantized coefficients from quantization of the fixed quantization method according to one or more quantization modification methods of the set consisting of a first quantization modification method, a second quantization modification method, a third quantization modification method, a fourth quantization modification method, and a fifth quantization modification method, the first quantization modification method including replacing an isolated quantized coefficient having the second-most likely-to-occur amplitude with a quantized coefficient having the most likely-to-occur amplitude, the second quantization modification method including replacing an isolated quantized coefficient having the most likely-to-occur amplitude with a quantized coefficient having the second-most likely-to-occur amplitude, the third quantization modification method including replacing a pair of quantized coefficients starting with first quantized coefficient having the most likely-to-occur amplitude followed by a second quantized coefficient having the second-most likely-to-occur amplitude, the pair preceded by a sequence of one or more quantized coefficients having other than the most likely-to-occur amplitude and followed by one or more quantized coefficients having the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, the fourth quantization modification method including replacing a pair of coefficients with the first quantized coefficient having the second-most likely-to-occur amplitude followed by a second quantized coefficient having the most likely-to-occur amplitude, the pair preceded by a sequence of one or more quantized coefficients having the most likely-to-occur amplitude and followed by one or more quantized coefficients having other than the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, and the fifth quantization modification method including replacing, in a position event, a quantized coefficient having the third-most likely-to-occur amplitude followed by a trailing sequence of one or more coefficients having the second-most likely-to-occur amplitude in the position event, no other coefficients having other that the most likely-to-occur amplitude following the trailing sequence in the position event, the modifying the quantization including at least the second quantization modification method, the third quantization modification method, the fourth quantization modification method, or the fifth quantization modification method.

24. An apparatus comprising:

means for quantizing and encoding configured to quantize and encode an ordered series of transform coefficients of a block of image data using a plurality of variable length code (VLC) mappings to form a coded bitstream, the ordering from low to high spatial frequency according to a transform, the means for quantizing and encoding comprising:

means for quantizing and encoding the coefficients of a first region of the ordered series using one or more VLC mappings, the first region being possibly the whole ordered series, wherein the quantizing of the first region includes, for a fixed quantization method that quantizes coefficients to have values that can have a most likely-to-occur amplitude, a second-most likely-to-occur amplitude, and at least one more amplitude, including a third most-likely-to occur amplitude:

quantizing to have the second-most likely-to-occur amplitude at least one coefficient that would be quantized by the fixed quantization method to have the most-likely-to occur amplitude;

quantizing to have the most-likely-to occur amplitude at least one coefficient that would be quantized by the fixed quantization method to have the second-most-likely-to occur amplitude; and using the fixed quantization method to quantize any coefficient that is quantized by the fixed quantization method to have other than the most likely-to-occur amplitude, other than the second-most likely-to-occur amplitude, or other than the third-most likely-to-occur amplitude.

25. A non-transitory computer-readable storage medium encoded with computer-executable instructions that when executed by at least one processor of a processing system causes carrying out a method of decoding a coded bitstream, the coded bitstream including a set of concatenated codewords, the method comprising:

recognizing codewords in the bitstream, the codewords formed by a coding method of coding an ordered series of transform coefficients of a block of image data using one or more of a plurality of variable length code (VLC) mappings; and decoding the recognized codewords using one or more of the plurality of VLC mappings, wherein the coded bitstream is formed by a coding method comprising:

for a first region of an ordered series of transform coefficients of a block of image data, the ordering from low to high spatial frequency according to a transform, the first region possibly the whole region, and for a fixed quantization method that quantizes coefficient values of blocks of image data to quantized values that have amplitudes including a most likely-to-occur amplitude, a second-most likely-to-occur amplitude and at least one other amplitude, including a third-most likely-to-occur amplitude:

quantizing and encoding the first region and any other regions of the ordered series to form the coded bitstream;

wherein the quantizing and encoding of the first region uses one or more VLC mappings, and wherein the quantizing of the first region includes quantizing to have the second-most likely-to-occur amplitude at least one coefficient that would be quantized by the fixed quantization method to have the most likely-to-occur amplitude, quantizing to have the most likely-to-occur amplitude at least one coefficient that would be quantized by the fixed quantization method to have the second-most likely-to-occur amplitude, and using the fixed quantization method to quantize any coefficient that is quantized by the fixed quantization method to have other than the most likely-to-occur amplitude, other than the second-most likely-to-occur amplitude, or other than the third-most likely-to-occur amplitude.

26. A non-transitory computer-readable storage medium as recited in claim 25, wherein the series on which the coding method operates is an ordered sequence of quantized transform coefficients quantized by the fixed quantization method, and wherein the coding method comprises, for the first region which could be the whole series:

encoding the position of events in the first region using one or more position VLC mappings, each event whose position is encoded including either exactly one quantized coefficient having other than the most likely-to-occur amplitude or a cluster of quantized coefficients each having other than the most likely-to-occur amplitude; and encoding any amplitude value other than the most likely-to-occur amplitude that is still to be encoded, the encoding according to one or more amplitude VLC mappings, wherein the encoding of the position of events includes modifying the quantization of quantized coefficients from quantization of the fixed quantization method according to one or more quantization modification methods of the set consisting of a first quantization modification method, a second quantization modification method, a third quantization modification method, a fourth quantization modification method, and a fifth quantization modification method, the first quantization modification method including replacing an isolated quantized coefficient having the second-most likely-to-occur amplitude with a quantized coefficient having the most likely-to-occur amplitude, the second quantization modification method including replacing an isolated quantized coefficient having the most likely-to-occur amplitude with a quantized coefficient having the second-most likely-to-occur amplitude, the third quantization modification method including replacing a pair of quantized coefficients starting with first quantized coefficient having the most likely-to-occur amplitude followed by a second quantized coefficient having the second-most likely-to-occur amplitude, the pair preceded by a sequence of one or more quantized coefficients having other than the most likely-to-occur amplitude and followed by one or more quantized coefficients having the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, the fourth quantization modification method including replacing a pair of coefficients with the first quantized coefficient having the second-most likely-to-occur amplitude followed by a second quantized coefficient having the most likely-to-occur amplitude, the pair preceded by a sequence of one or more quantized coefficients having the most likely-to-occur amplitude and followed by one or more quantized coefficients having other than the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, and the fifth quantization modification method including replacing, in a position event, a quantized coefficient having the third-most likely-to-occur amplitude followed by a trailing sequence of one or more coefficients having the second-most likely-to-occur amplitude in the position event, no other coefficients having other that the most likely-to-occur amplitude following the trailing sequence in the position event, the modifying the quantization including at least the second quantization modification method, the third quantization modification method, the fourth quantization modification method, or the fifth quantization modification method.

27. A non-transitory computer-readable storage medium as recited in claim 26, wherein the position coding of events includes jointly encoding joint position and amplitude events, the next joint position and amplitude event being defined by the next cluster of one or more consecutive coefficients each having any other than the most likely-to-occur amplitude, each joint position and amplitude event defined by three parameters: the number, possibly zero, of coefficients having the most likely-to-occur amplitude preceding the cluster, the number of coefficients in the cluster having other than the most likely-to-occur amplitude, and a third parameter related to amplitudes in the cluster having other than the most likely-to-occur amplitude, the position coding for the each cluster that is being position coded being according to at least one three-dimensional joint VLC mapping, wherein for at least one cluster length, the third parameter includes an indication of the number of consecutive trailing coefficients in the cluster that each have the second-most likely-to-occur amplitude, wherein encoding the position of events in the first region uses a plurality of VLC mappings, the encoding the position including initially selecting an initial position VLC mapping, and thereafter switching between position VLC mappings according to one or more position VLC selection criteria, including at least one context-based position VLC selection criterion; and wherein encoding any amplitude that is still to be encoded is according to one of a plurality of amplitude VLC mappings, and includes initially selecting an amplitude VLC mapping, and switching between the plurality of amplitude VLC mappings according to one or more amplitude VLC selection criteria, including at least one context-based amplitude VLC selection criterion, wherein by a context-based selection criterion is meant a criterion that during encoding is known or derivable from one or more previously encoded items of information.

28. A decoding apparatus comprising:

a codeword recognizer configured to accept a coded bitstream and to recognize codewords in the bitstream, the codewords formed by a coding method of coding an ordered series of transform coefficients of a block of image data using one or more of a plurality of VLC mappings; and a codeword decoder configured to decode the recognized codewords using one or more of the plurality of VLC mappings, wherein the coded bitstream is formed by a coding method comprising:

for a first region of an ordered series of transform coefficients of a block of image data, the ordering from low to high spatial frequency according to a transform, the first region possibly the whole region, and for a fixed quantization method that quantizes coefficient values of blocks of image data to quantized values that have amplitudes including a most likely-to-occur amplitude, a second-most likely-to-occur amplitude and at least one other amplitude, including a third-most likely-to-occur amplitude:

quantizing and encoding the first region and any other regions of the ordered series to form the coded bitstream, wherein the quantizing and encoding of the first region uses one or more VLC mappings, and wherein the quantizing of the first region includes quantizing to have the second-most likely-to-occur amplitude at least one coefficient that would be quantized by the fixed quantization method to have the most likely-to-occur amplitude, quantizing to have the most likely-to-occur amplitude at least one coefficient that would be quantized by the fixed quantization method to have the second-most likely-to-occur amplitude, and using the fixed quantization method to quantize any coefficient that is quantized by the fixed quantization method to have other than the most likely-to-occur amplitude, other than the second-most likely-to-occur amplitude, or other than the third-most likely-to-occur amplitude.

29. A decoding apparatus as recited in claim 28, wherein the series on which the coding method operates is an ordered sequence of quantized transform coefficients quantized by the fixed quantization method, and
  wherein the coding method comprises, for the first region which could be the whole series:
    encoding the position of events in the first region using one or more position VLC mappings, each event whose position is encoded including either exactly one quantized coefficient having other than the most likely-to-occur amplitude or a cluster of quantized coefficients each having other than the most likely-to-occur amplitude; and
    encoding any amplitude value other than the most likely-to-occur amplitude that is still to be encoded, the encoding according to one or more amplitude VLC mappings,
    wherein the encoding of the position of events includes modifying the quantization of quantized coefficients from quantization of the fixed quantization method according to one or more quantization modification methods of the set consisting of a first quantization modification method, a second quantization modification method, a third quantization modification method, a fourth quantization modification method, and a fifth quantization modification method,
    the first quantization modification method including replacing an isolated quantized coefficient having the second-most likely-to-occur amplitude with a quantized coefficient having the most likely-to-occur amplitude,
    the second quantization modification method including replacing an isolated quantized coefficient having the most likely-to-occur amplitude with a quantized coefficient having the second-most likely-to-occur amplitude,
    the third quantization modification method including replacing a pair of quantized coefficients starting with first quantized coefficient having the most likely-to-occur amplitude followed by a second quantized coefficient having the second-most likely-to-occur amplitude, the pair preceded by a sequence of one or more quantized coefficients having other than the most likely-to-occur amplitude and followed by one or more quantized coefficients having the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter,
    the fourth quantization modification method including replacing a pair of coefficients with the first quantized coefficient having the second-most likely-to-occur amplitude followed by a second quantized coefficient having the most likely-to-occur amplitude, the pair preceded by a sequence of one or more quantized coefficients having the most likely-to-occur amplitude and followed by one or more quantized coefficients having other than the most likely-to-occur amplitude, the replacing with either a pair of quantized coefficients each having the most likely-to-occur amplitude or a pair of quantized coefficients each having the second-most likely-to-occur amplitude according to which replacing results in a coded bitstream that is shorter, and
    the fifth quantization modification method including replacing, in a position event, a quantized coefficient having the third-most likely-to-occur amplitude followed by a trailing sequence of one or more coefficients having the second-most likely-to-occur amplitude in the position event, no other coefficients having other that the most likely-to-occur amplitude following the trailing sequence in the position event,
    the modifying the quantization including at least the second quantization modification method, the third quantization modification method, the fourth quantization modification method, or the fifth quantization modification method.

30. A decoding apparatus as recited in claim 29, wherein the position coding of events includes jointly encoding the next joint position and amplitude event that is defined by the next cluster of one or more consecutive coefficients each having any other than the most likely-to-occur amplitude, each event defined by three parameters: the number, possibly zero, of coefficients having the most likely-to-occur amplitude preceding the cluster, the number of coefficients in the cluster having other than the most likely-to-occur amplitude, and a third parameter related to amplitudes in the cluster having other than the most likely-to-occur amplitude, the position coding for the each cluster that is being position coded being according to at least one three-dimensional joint VLC mapping,
  wherein for at least one cluster length, the third parameter includes an indication of the number of consecutive trailing coefficients in the cluster that each have the second-most likely-to-occur amplitude,
  wherein encoding the position of events in the first region uses a plurality of VLC mappings, the encoding the position including initially selecting an initial position VLC mapping, and thereafter switching between position VLC mappings according to one or more position VLC selection criteria, including at least one context-based position VLC selection criterion; and
  wherein encoding any amplitude that is still to be encoded is according to one of a plurality of amplitude VLC mappings, and includes initially selecting an amplitude VLC mapping, and switching between the plurality of amplitude VLC mappings according to one or more amplitude VLC selection criteria, including at least one context-based amplitude VLC selection criterion,
  wherein by a context-based selection criterion is meant a criterion that during encoding is known or derivable from one or more previously encoded items of information.

* * * * *